(12) United States Patent
Kaneko

(10) Patent No.: US 9,679,907 B1
(45) Date of Patent: Jun. 13, 2017

(54) THREE-DIMENSIONAL MEMORY DEVICE WITH CHARGE-TRAPPING-FREE GATE DIELECTRIC FOR TOP SELECT GATE ELECTRODE AND METHOD OF MAKING THEREOF

(71) Applicant: SANDISK TECHNOLOGIES INC., Plano, TX (US)

(72) Inventor: Ryosuke Kaneko, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/056,510

(22) Filed: Feb. 29, 2016

(51) Int. Cl.
*H01L 29/66* (2006.01)
*H01L 27/1157* (2017.01)
*H01L 27/11582* (2017.01)
*H01L 29/51* (2006.01)
*H01L 21/3115* (2006.01)
*H01L 21/311* (2006.01)

(52) U.S. Cl.
CPC ..... *H01L 27/1157* (2013.01); *H01L 21/31111* (2013.01); *H01L 21/31155* (2013.01); *H01L 27/11582* (2013.01); *H01L 29/51* (2013.01)

(58) Field of Classification Search
CPC ........... H01L 27/1157; H01L 27/11582; H01L 21/31111; H01L 21/31155
USPC .......................................... 257/325; 438/287
See application file for complete search history.

(56) References Cited

U.S. PATENT DOCUMENTS

| 5,915,167 | A  | 6/1999 | Leedy |
| 9,368,509 | B2 | 6/2016 | Pang et al. |
| 2009/0121271 | A1 | 5/2009 | Son et al. |
| 2010/0133606 | A1 | 6/2010 | Jang et al. |
| 2010/0163968 | A1 | 7/2010 | Kim et al. |
| 2010/0213537 | A1* | 8/2010 | Fukuzumi ......... H01L 27/11578 257/326 |
| 2011/0069552 | A1 | 3/2011 | Itagaki et al. |
| 2011/0076819 | A1 | 3/2011 | Kim et al. |
| 2012/0049268 | A1 | 3/2012 | Chang et al. |
| 2012/0112260 | A1 | 5/2012 | Kim et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Tu-Tu Ho
(74) *Attorney, Agent, or Firm* — The Marbury Law Group PLLC

(57) ABSTRACT

A portion of a charge trapping layer adjacent to a select drain gate electrode can be removed employing a differential-rate etch process that provides an accelerated etch rate to a doped portion with respect to an undoped portion. If a silicon nitride layer is employed as the charge trapping layer, then angled ion implantation of boron atoms to an upper portion of the silicon nitride layer can increase the etch rate of the boron-doped portion of the silicon nitride layer in phosphoric acid. The charge trapping layer is etched back such that a remaining portion of the charge trapping layer can be present only at levels of control gate electrodes, and absent at each level of select drain gate electrodes. Threshold voltage shift for the select drain gate electrodes can be eliminated or reduced by removal of the charge trapping layer at each level of the select drain gate electrodes.

18 Claims, 18 Drawing Sheets

(56) References Cited

U.S. PATENT DOCUMENTS

2012/0299117 A1 11/2012 Lee et al.
2013/0089974 A1 4/2013 Lee et al.
2013/0095646 A1 4/2013 Alsmeier et al.
2014/0070302 A1 3/2014 Yoo et al.
2014/0126290 A1 5/2014 Sakui et al.

OTHER PUBLICATIONS

International Search Report and Written Opinion of International Searching Authority for International Application No. PCT/US2015/051175, issued Mar. 14, 2016, 24 pages.
Invitation to Pay Additional Fees, International Application No. PCT/US2015/051175, issued Dec. 17, 2015, 7pgs.

* cited by examiner

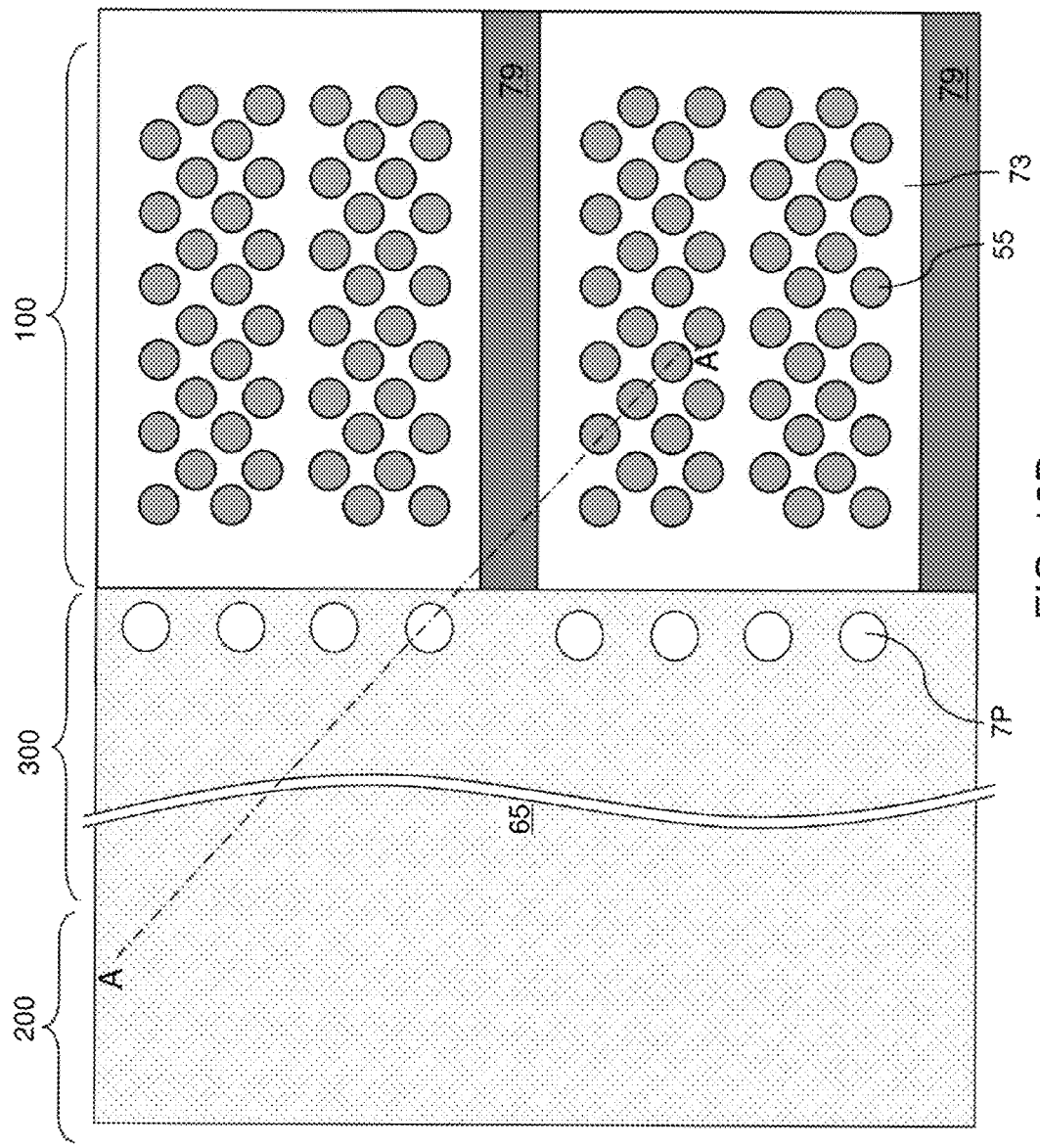

ND METHOD OF MAKING
THREE-DIMENSIONAL MEMORY DEVICE WITH CHARGE-TRAPPING-FREE GATE DIELECTRIC FOR TOP SELECT GATE ELECTRODE AND METHOD OF MAKING THEREOF

FIELD

The present disclosure relates generally to the field of three-dimensional memory devices and specifically to three-dimensional memory devices including a vertical stack of multilevel memory arrays and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and a memory stack structure extending through the alternating stack and comprising a memory film and a vertical semiconductor channel contacting an inner sidewall of the memory film. A lower portion of the memory film comprises a first lateral stack including, from outside to inside, a lower portion of a blocking dielectric layer, a charge trapping layer, and a lower portion of a tunneling dielectric layer. An upper portion of the memory film comprises a second lateral stack including, from outside to inside, an upper portion of the blocking dielectric layer and an upper portion of the tunneling dielectric layer in physical contact with the upper portion of the blocking dielectric layer.

According to another aspect of the present disclosure, a method of forming a three-dimensional memory device is provided. An alternating stack of insulating layers and spacer material layers is formed over a substrate. A memory opening is formed through the alternating stack. A blocking dielectric layer and a charge trapping layer are formed in the memory opening. Dopant atoms are implanted into an upper portion of the charge trapping layer, while preventing introduction of the dopant atoms in a lower portion of the charge trapping layer. The upper portion of the charge trapping layer is removed while thinning the lower portion of the charge trapping layer. An inner sidewall of an upper portion of the blocking dielectric layer is physically exposed above a remaining lower portion of the charge trapping layer. A tunneling dielectric layer and a vertical semiconductor channel are formed within the remaining lower portion of the charge trapping layer and the blocking dielectric layer.

BRIEF DESCRIPTION OF THE DRAWINGS

FIG. 12B is a partial see-through top-down view of the exemplary structure of FIG. 12A. The vertical plane A-A' is the plane of the vertical cross-sectional view of FIG. 12A.

DETAILED DESCRIPTION

Figure 1:
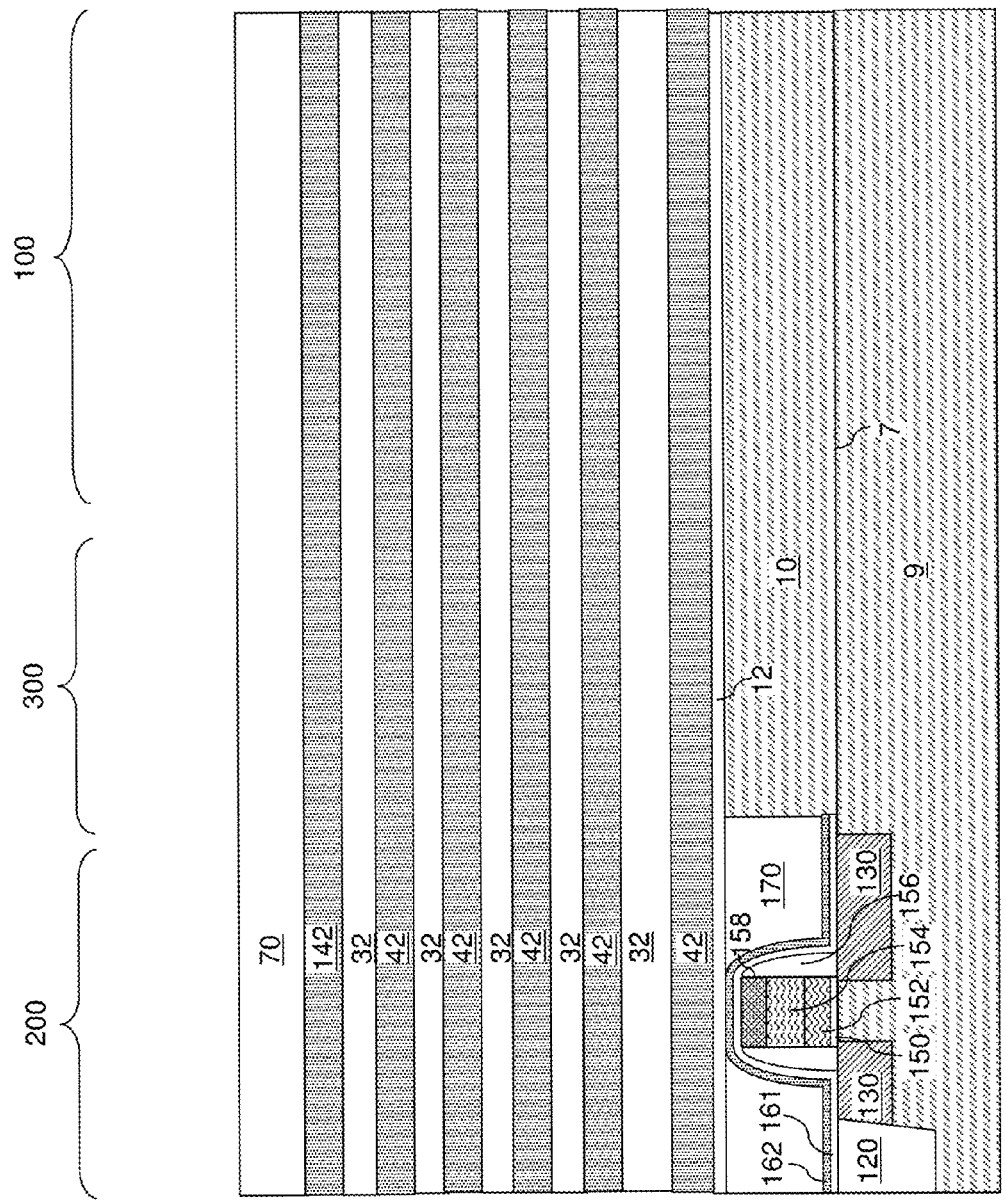
FIG. 1 is a vertical cross-sectional view of an exemplary structure after formation of an alternating stack of insulating material layers and spacer material layers according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure. Non-limiting examples of the multilevel memory structures include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material (e.g., silicon, such as single crystal silicon), at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9 and/or in an optional semiconductor material layer 10 that is formed over the substrate semiconductor layer 9.

At least one semiconductor device for a peripheral circuitry can be formed on a portion of the substrate semiconductor layer 9 in a peripheral device region 200, which is separated from a device region 100 by a contact region 300. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 70. In one embodiment the planarized top surface of the planarization dielectric layer 70 can be coplanar with a top surface of the dielectric liners (161, 162). Subsequently, the planarization dielectric layer 70 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 70.

Optionally, a gate dielectric layer 12 can be formed above the semiconductor material layer 10 and the planarization dielectric layer 70. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layers (42, 142)) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layer or with an instance of the second material layer, and may end with an instance of the first material layer or with an instance of the second material layer. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers (42, 142), and constitutes a prototype stack of alternating layers comprising insulating layers 32 and sacrificial material layers (42, 142). As used herein, a "prototype" structure or an "in-process" structure refers to a transient structure that is subsequently modified in the shape or composition of at least one component therein.

The sacrificial material layers (42, 142) (which are spacer material layers) can include a first subset of the sacrificial material layers (42, 142) (which is a first subset of the spacer material layers), which is formed at levels at which the sacrificial material layers are subsequently replaced with control gate electrodes and select gate electrodes for a NAND string. Such sacrificial material layers are herein referred to as control-gate-level sacrificial material layers 42. The sacrificial material layers (42, 142) can include a second subset of the sacrificial material layers (42, 142) (which is a second subset of the spacer material layers), which is formed at each level at which at least one drain select gate is subsequently formed. Each such sacrificial material layer is herein referred to as a drain-select-level sacrificial material layer 142. The at least one drain-select-level sacrificial material layer 142 is formed above the control-gate-level sacrificial material layers 42.

The stack of the alternating plurality is herein referred to as an alternating stack (32, 42, 142). In one embodiment, the alternating stack (32, 42, 142) can include insulating layers 32 composed of the first material, and sacrificial material layers (42, 142) composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers (42, 142) is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers (42, 142) may comprise an insulating material, a semiconductor material, or a conductive material. The second material of the sacrificial material layers (42, 142) can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers (42, 142) can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers (42, 142) can be formed, for example, CVD or atomic layer deposition (ALD).

The sacrificial material layers (42, 142) can be suitably patterned so that conductive material portions to be subsequently formed by replacement of the sacrificial material layers (42, 142) can function as electrically conductive electrodes, such as the control gate electrodes and select gate electrodes of the monolithic three-dimensional NAND string memory devices to be subsequently formed. The sacrificial material layers (42, 142) may comprise a portion having a strip shape extending substantially parallel to the major surface 7 of the substrate.

The thicknesses of the insulating layers 32 and the sacrificial material layers (42, 142) can be in a range from 20 nm to 50 nm, although lesser and greater thicknesses can be employed for each insulating layer 32 and for each sacrificial material layer (42, 142). The number of repetitions of the pairs of an insulating layer 32 and a sacrificial material layer (e.g., a control gate electrode or a sacrificial material layer) (42, 142) can be in a range from 2 to 1,024, and typically from 8 to 256, although a greater number of repetitions can also be employed. The top and bottom gate electrodes in the stack may function as the select gate electrodes. In one embodiment, each sacrificial material layer (42, 142) in the alternating stack (32, 42, 142) can have a uniform thickness that is substantially invariant within each respective sacrificial material layer (42, 142).

A subset of the sacrificial material layers located at one or more levels in which drain select gate electrodes are to be subsequently formed constitutes a set of at least one drain-select-level sacrificial material layer 142. The number of layers in the set of at least one drain-select-level sacrificial material layer 142 can be the same as the number of one or more drain select gate electrodes to be subsequently formed, and may be 1, or may be a number selected from a range from 2 to 10.

Optionally, an insulating cap layer 70 can be formed over the alternating stack (32, 42, 142), which includes the at least one drain-select-level sacrificial material layer 142. The insulating cap layer 70 includes a dielectric material that is different from the material of the sacrificial material layers (42, 142). In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
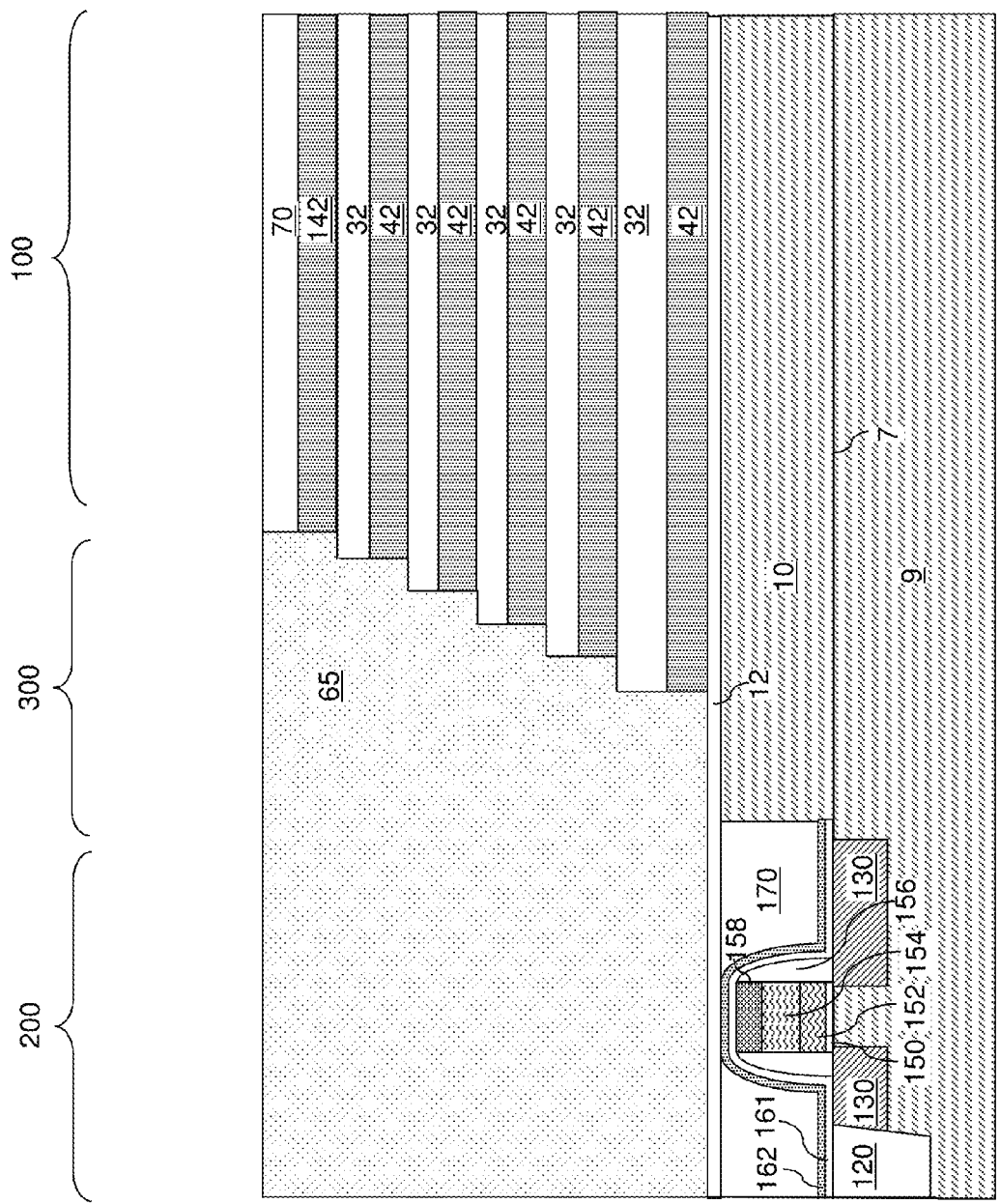
FIG. 2 is a vertical cross-sectional view of the exemplary structure after formation of a stepped terrace and a retro-stepped dielectric material portion according to an embodiment of the present disclosure.

Referring to FIG. 2, a stepped cavity can be formed within the contact region 300 and the peripheral device region 200. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the dielectric cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. The retro-stepped dielectric material portion 65 may extend over the peripheral device region 200.

Figure 3:
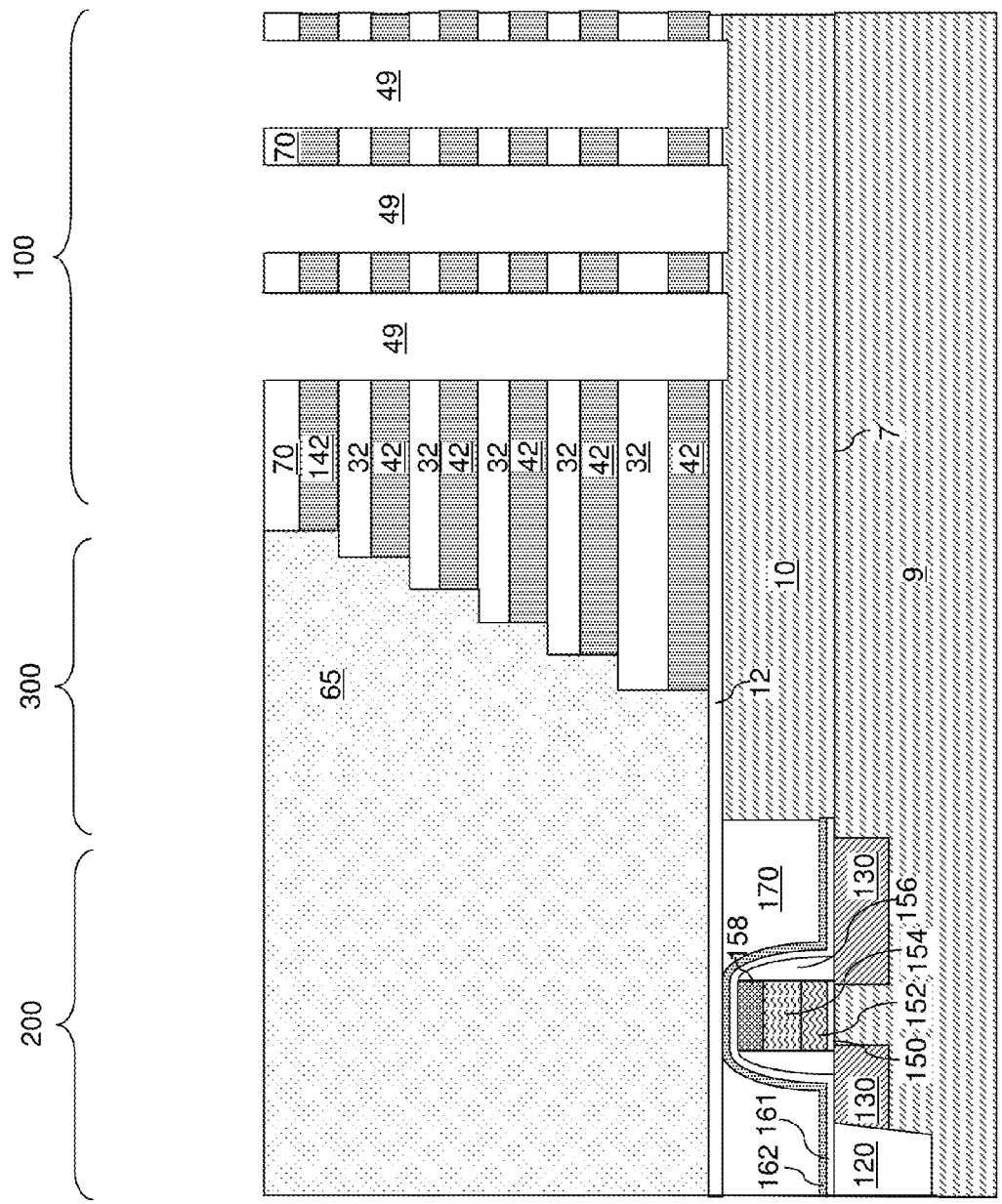
FIG. 3 is a vertical cross-sectional view of the exemplary structure after formation of memory openings according to an embodiment of the present disclosure.

Referring to FIG. 3, a lithographic material stack (not shown) including at least a photoresist layer can be formed over the insulating cap layer 70 and the alternating stack (32, 42, 142), and can be lithographically patterned to form openings therein. The pattern in the lithographic material stack can be transferred through the insulating cap layer 70 and through entirety of the alternating stack (32, 42, 142) by at least one anisotropic etch that employs the patterned lithographic material stack as an etch mask. Portions of the alternating stack (32, 42, 142) underlying the openings in the patterned lithographic material stack are etched to form memory openings 49. In other words, the transfer of the pattern in the patterned lithographic material stack through the alternating stack (32, 42, 142) forms the memory openings 49 that extend through the alternating stack (32, 42, 142). The chemistry of the anisotropic etch process employed to etch through the materials of the alternating stack (32, 42, 142) can alternate to optimize etching of the first and second materials in the alternating stack (32, 42, 142). The anisotropic etch can be, for example, a series of reactive ion etches. Optionally, the gate dielectric layer 12 may be used as an etch stop layer between the alternating stack (32, 42, 142) and the substrate. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42, 142) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Each memory opening 49 extends through the insulating cap layer 70, the alternating stack (32, 42, 142), the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers (42, 142) can be laterally recessed partially to form lateral recesses (not shown), for example, by an isotropic etch.

Figure 4:
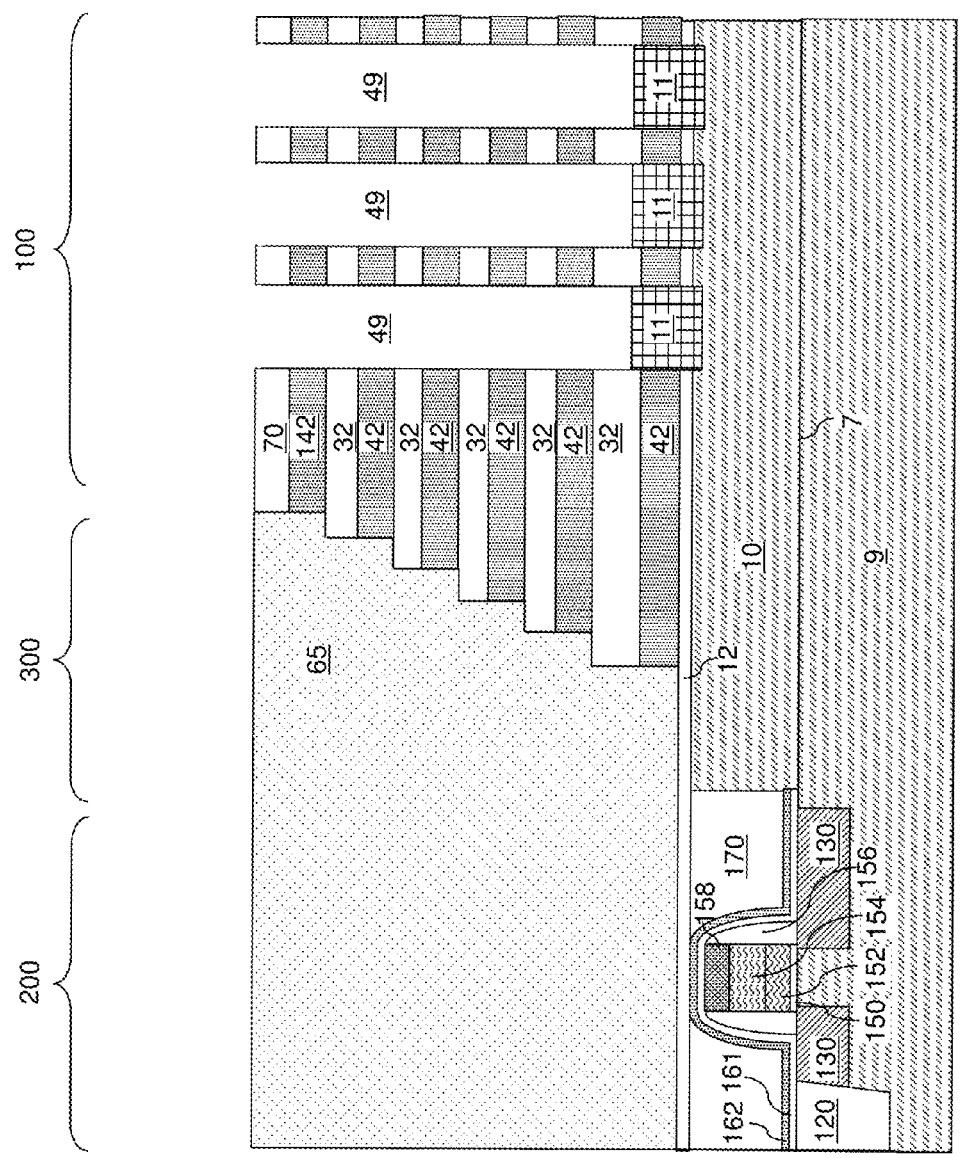
FIG. 4 is a vertical cross-sectional view of the exemplary structure after formation of epitaxial channel portions according to an embodiment of the present disclosure.

Referring to FIG. 4, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer (42, 142). In this case, at least one source select gate electrode can be subsequently formed by replacing each sacrificial material layer (42, 142) located below the horizontal plane including the top surfaces of the epitaxial channel portions 11 with a respective conductive material layer.

Figure 5:
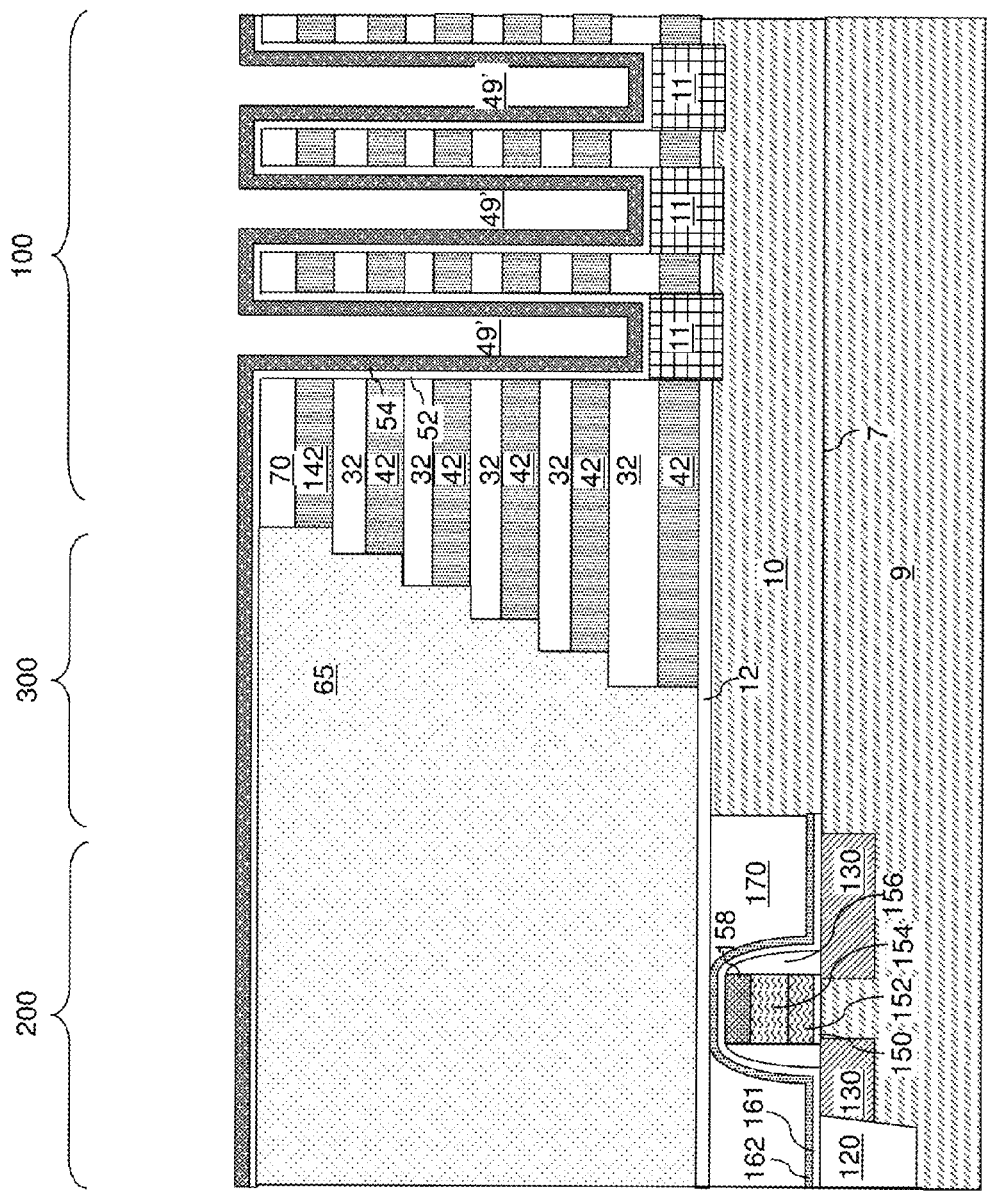
FIG. 5 is a vertical cross-sectional view of the exemplary structure after formation of a blocking dielectric layer and a charge trapping layer according to an embodiment of the present disclosure.

Referring to FIG. 5, a blocking dielectric layer 52 and a charge trapping layer 54 (i.e., a charge storage layer) can be sequentially deposited in the memory openings 49. The blocking dielectric layer 52 can include a single dielectric material layer or a layer stack of multiple dielectric material layers. The blocking dielectric layer 52 can be deposited on the sidewalls of each memory opening 49 by a conformal deposition method. The blocking dielectric layer 52 can be deposited, for example, by chemical vapor deposition (CVD), atomic layer deposition (ALD), pulsed laser deposition (PLD), liquid source misted chemical deposition, or a combination thereof. The thickness of the blocking dielectric layer 52 can be in a range from 1 nm to 20 nm, although lesser and greater thicknesses can also be employed. The blocking dielectric layer 52 can subsequently function as a dielectric material portion that blocks leakage of stored electrical charges to control gate electrodes.

In one embodiment, the blocking dielectric layer 52 includes a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. In one embodiment, the blocking dielectric layer 52 includes aluminum oxide.

Alternatively or additionally, the blocking dielectric layer 52 can include silicon oxide, a dielectric metal oxide having a different composition than the blocking dielectric layer 52, silicon oxynitride, silicon nitride, or a combination thereof. In one embodiment, the blocking dielectric layer 52 can include silicon oxide. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed.

Subsequently, the charge trapping layer 54 can be deposited as a continuous material layer over the blocking dielectric layer 52. In one embodiment, the charge trapping layer 54 can be deposited as a conformal layer having a substantially same thickness throughout. As used herein, an element has a substantially same thickness throughout if the thickness of the element does not deviate from the average thickness of the element by more than 20% at all locations of the element. In one embodiment, the charge trapping layer 54 can be a charge trapping material including a dielectric charge trapping material, which can be, for example, silicon nitride. In one embodiment, the charge trapping layer 54 includes a silicon nitride layer.

The charge trapping layer 54 can be formed as a single charge trapping layer of homogeneous composition, or can include a stack of multiple charge trapping layers. The charge trapping layer 54 can be formed, for example, by chemical vapor deposition (CVD), atomic layer deposition (ALD), physical vapor deposition (PVD), or any suitable deposition technique for storing electrical charges therein.

The initial thickness of the charge trapping layer 54 is selected such that the final thickness of the charge trapping layer 54 after a subsequent etch process in regions in which the charge trapping layer 54 remains can be in a range from 2 nm to 20 nm, although lesser and greater final thicknesses can also be employed. In one embodiment, the initial thickness of the charge trapping layer 54 can be in a range from 200% to 400% of the final thickness of the charge trapping layer 54. In one embodiment, the initial thickness of the charge trapping layer 54 can be in a range from 6 nm to 60 nm. In an illustrative example, a silicon nitride layer having a thickness of about 16 to 18 nm can be employed as the charge trapping layer 54. A cavity 49' is present within each unfilled volume of the memory openings 49.

Figure 6:
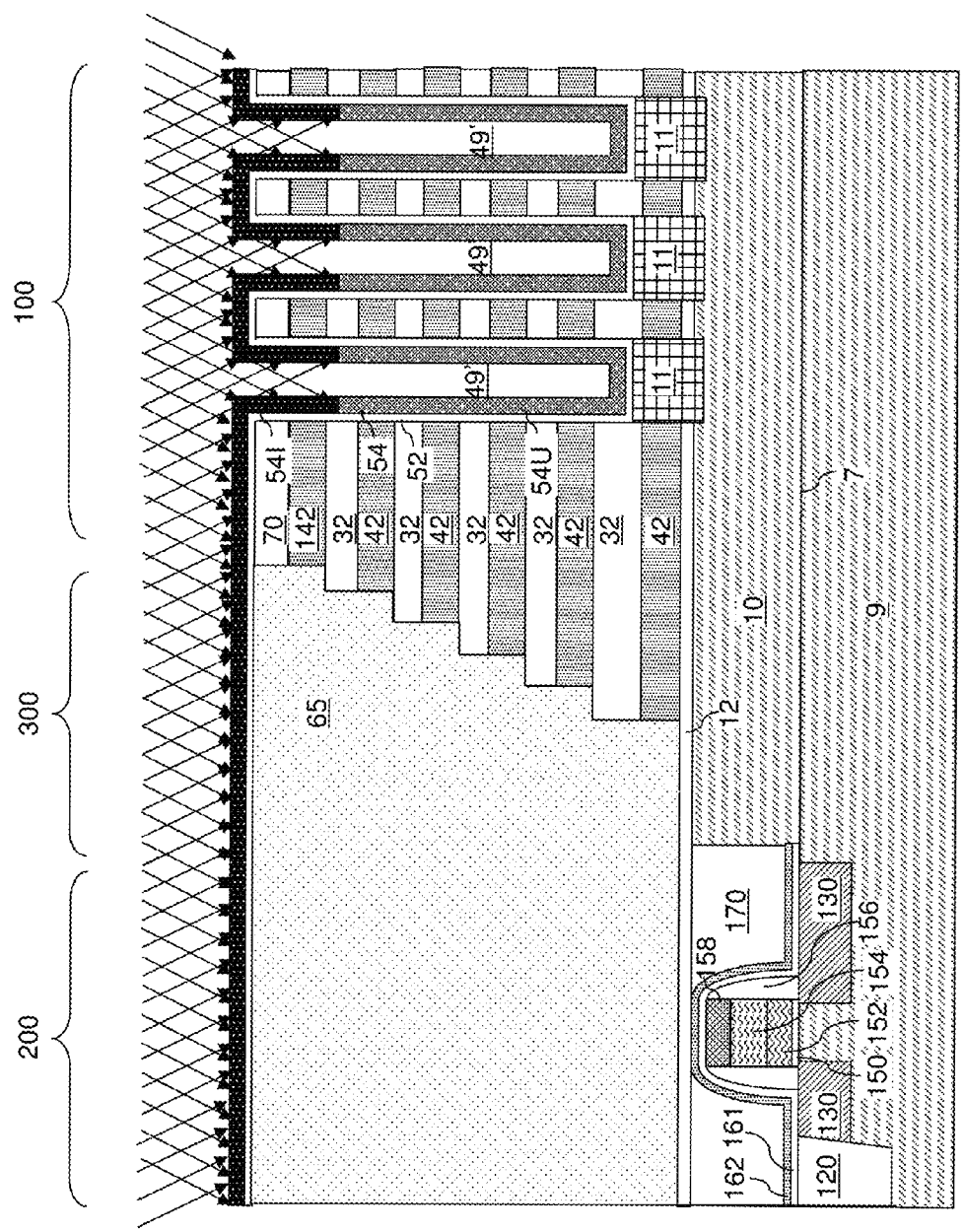
FIG. 6 is a vertical cross-sectional view of the exemplary structure during angled ion implantation of dopants into upper portions of the charge trapping layer with a varying azimuthal angle according to an embodiment of the present disclosure.

Referring to FIG. 6, dopant atoms can be implanted into an upper portion of the charge trapping layer 54, while preventing introduction of the dopant atoms in lower portions of the charge trapping layer 54. This process can be performed by angled ion implantation of the dopant atoms. The lower portions of the charge trapping layer 54 are located at levels of the first subset of the spacer material layers excluding a topmost spacer material layer, which can be the first subset of the sacrificial material layers (42, 142) including the control-gate-level sacrificial material layers 42. The upper portion of the charge trapping layer 54 is formed at the at least one level of the second subset of the spacer material layers including the topmost spacer material layer, which can be the second subset of the sacrificial material layers (42, 142) including the drain-select-level sacrificial material layers 142.

The ion beam can impinge on portions of the charge trapping layer 54 at a non-zero tilt angle. The tilt angle of the ion beam is the angle between the direction of the ion beam and the vertical line (i.e., line perpendicular to the top surface 7 of the substrate). The tilt angle of the ion beam with respect to the vertical line is selected such that portions 54I of the charge trapping layer 54 located at each level of the drain-select-level sacrificial material layer(s) 142 are implanted with the ions from the ion beam, and the portions 54U of the charge trapping layer 54 located adjacent to layers 42 (i.e., to the sacrificial material layers (42, 142) that are not drain-select-level sacrificial material layer(s)) are not implanted with the ions from the ion beam. In one embodiment, the tilt angle can be in a range from 20 degrees to 70 degrees, such as from 35 degrees to 55 degrees, including 45 to 50 degrees, although lesser and greater tilt angles can also be employed.

The species of the implanted ions can be selected such that the implanted ions substantially increase the etch rate of the material of the charge trapping layer 54. As used herein, a "substantial" increase in an etch rate refers to an increase that is greater than 20%, and preferably greater than 30%, such as greater than 40%. In one embodiment, the increase in the etch rate may be, for example, in a range from 20% to 100%. In one embodiment, the dopant atoms can include boron atoms. In case boron atoms are implanted as the implanted species into a silicon nitride material employed for the charge trapping layer 54, the etch rate of the boron-implanted portion 54I of the silicon nitride material in phosphoric acid can increase by about 60%. The dose and energy of the implanted boron atoms can be selected such that the atomic concentration of boron atoms in the implanted regions can be in a range from 0.1% to 5.0% of all atoms in the implanted portion of the charge trapping layer 54. In one embodiment, the boron atoms can be collaterally implanted into portions of the blocking dielectric layer located adjacent to the drain-select-level sacrificial material layer(s) 142.

In one embodiment, the dopants can be implanted into the upper portion(s) 54I of the charge trapping layer 54 by an ion implantation process employing a varying azimuthal angle. In other words, the azimuthal angle of the ion implantation is changed during the implantation of the dopant atoms such that the implanted upper portion(s) 54I of the charge trapping layer 54 forms an annular structure. As used herein, an azimuthal angle is defined as an angle between a first vertical plane including the direction of the ion beam and a second vertical plane that functions as a reference vertical plane, i.e., a vertical plane that defines the azimuthal angle of zero. The azimuthal angle may be continuously changed by 360 degrees, or can be changed in stepwise increments (such as by 30 degrees at a time). Each implanted region at an upper portion of each memory opening 49 forms a continuous annular region that is adjoined to a horizontal implanted portion of the charge trapping layer 54 that overlies the insulating cap layer 70.

Figure 7:
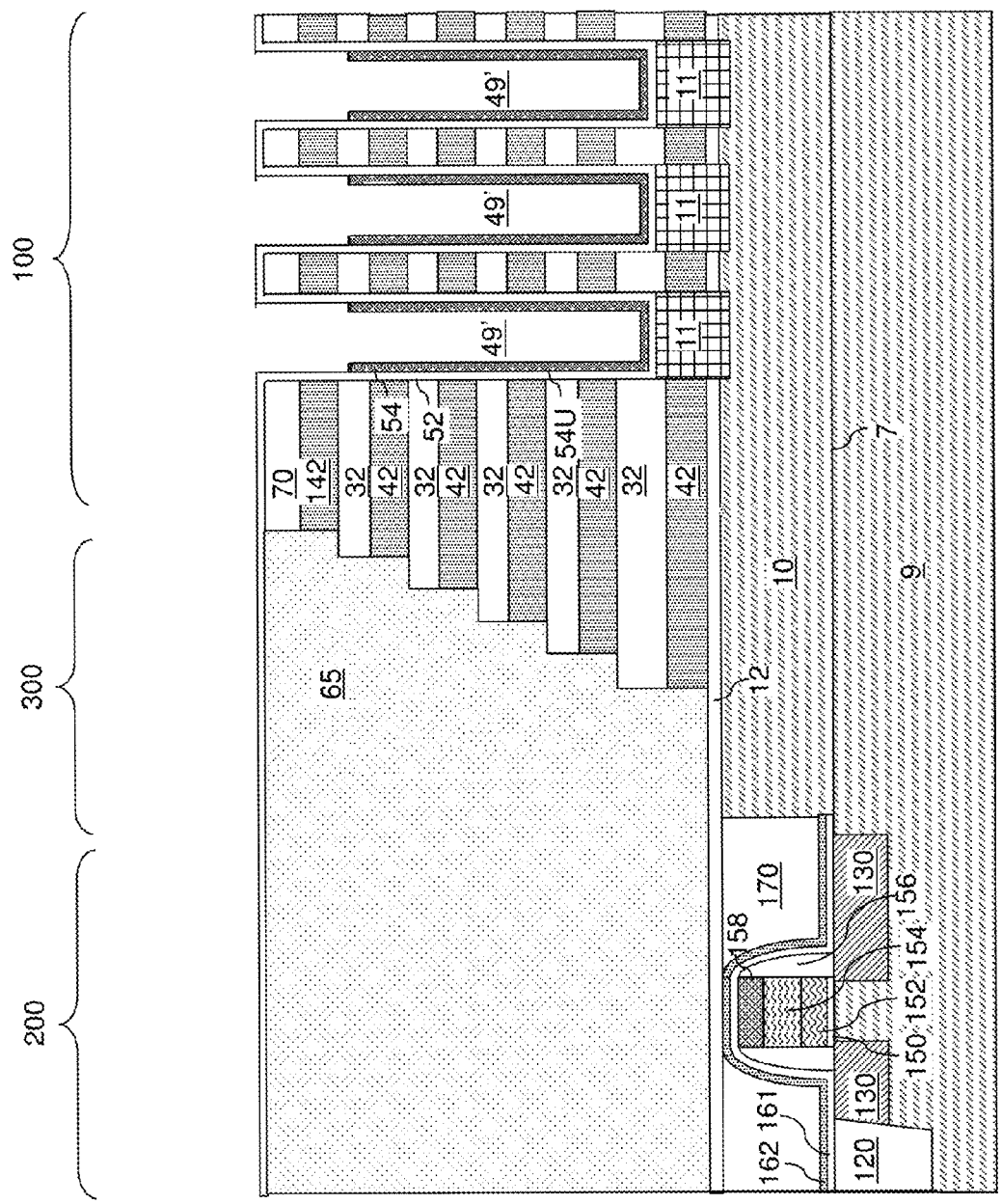
FIG. 7 is a vertical cross-sectional view of the exemplary structure after performing a differential-etch-rate etch process that removes the implanted upper portion of the charge trapping layer and thins lower portions of the charge trapping layer according to an embodiment of the present disclosure.

Referring to FIG. 7, a differential-etch-rate etch process (i.e., a selective etch process) is performed to remove the implanted upper portion(s) 54I of the charge trapping layer 54 while thinning lower portion(s) 54U of the charge trapping layer 54. As used herein, a "differential-etch-rate etch process" refers to an etch process that provides different etch rates depending on the composition of the material that is etched. Specifically, the differential-etch-rate etch process removes the implanted upper portion(s) of the charge trapping layer 54 at a greater etch rate than the unimplanted lower portion(s) of the charge trapping layer 54. The differential-etch-rate etch process is terminated after complete removal of the implanted portion(s) of the charge trapping layer 54, and at the time at which the thinned unimplanted portion(s) of the charge trapping layer 54 reaches the target final thickness (which can be in a range from 2 nm to 20 nm, such as from 4 nm to 10 nm, including 6 to 8 nm).

Within each memory opening, an inner sidewall of an upper portion of a blocking dielectric layer 52 is physically exposed above a remaining lower portion of the charge trapping layer 54. In one embodiment, each charge trapping layer 54 (that is a remaining portion 54U of the charge trapping layer 54 as provided at the processing steps of FIG. 4) can comprise a silicon nitride layer, the dopant atoms can comprise boron atoms, and the differential-etch-rate etch process can comprise a wet etch process employing phosphoric acid. In an exemplary case, a 16 to 18 nm thick silicon nitride layer can be provided as an initial charge trapping layer 54, and the duration of the wet etch employing phosphoric acid can be selected such that the boron-implanted portion of the silicon nitride layer is completely removed while each unimplanted portion of the silicon nitride layer is thinned to a 6 to 8 nm thick silicon nitride layer. Thus, the portion(s) 54I of the charge trapping layer 54 at, or above, the at least one drain-select-level sacrificial material layer 142 are removed, while the portion(s) 54U of the charge trapping layer 54 at the levels of the control-gate-level sacrificial material layers 42 are thinned to a target thickness by the etch process. In one embodiment, the final thickness of the charge trapping layer 54 can be in a range from 3 nm to 15 nm, although lesser and greater thicknesses can also be employed.

Figure 8:
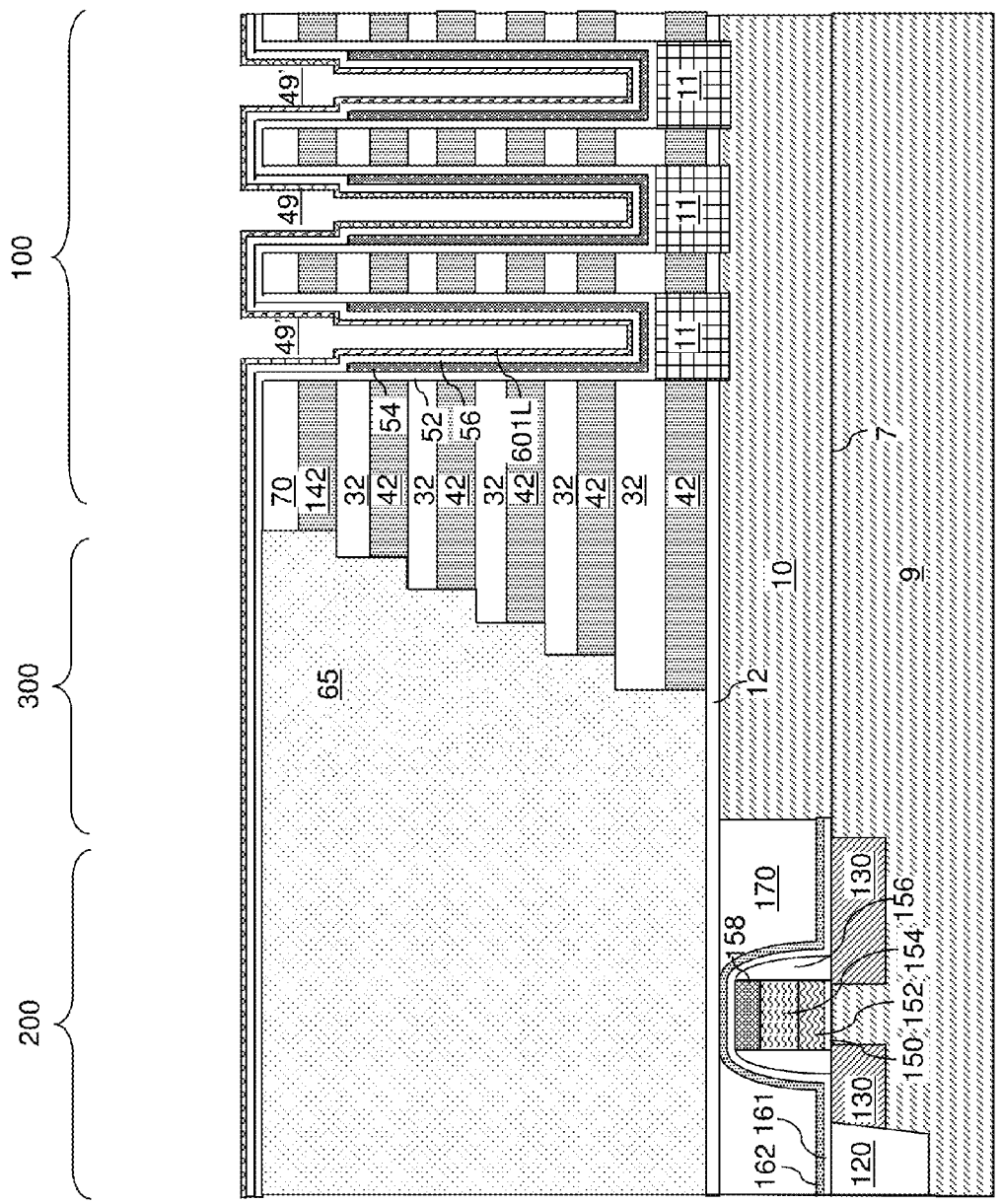
FIG. 8 is a vertical cross-sectional view of the exemplary structure after formation of a tunneling dielectric layer and a first semiconductor channel layer according to an embodiment of the present disclosure.

Referring to FIG. 8, a tunneling dielectric layer 56 can be deposited on the physically exposed surfaces of the blocking dielectric layer 52 and the charge trapping layer 54. The tunneling dielectric layer 56 can be formed directly on the physically exposed inner sidewall of the upper portion of the blocking dielectric layer 52 and directly on a sidewall of the remaining lower portions of the charge trapping layer 54. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer 601L according to an embodiment of the present disclosure. The first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed.

Figure 9:
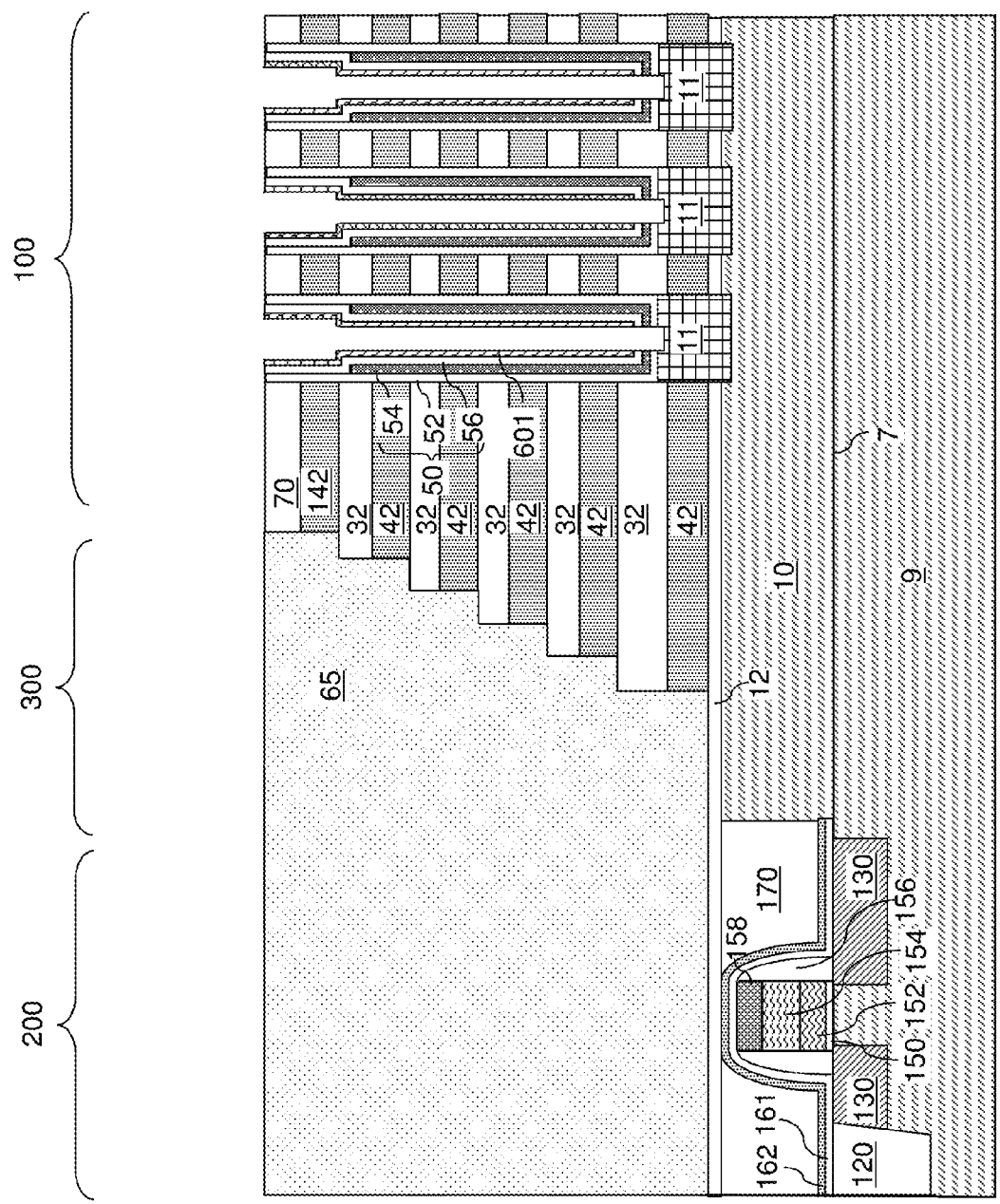
FIG. 9 is a vertical cross-sectional view of the exemplary structure after anisotropically etching the first semiconductor channel layer, the tunneling dielectric layer, the charge trapping layer, and the blocking dielectric layer according to an embodiment of the present disclosure.

Referring to FIG. 9, the optional first semiconductor channel layer 601L, the tunneling dielectric layer 56, the charge trapping layer 54, the blocking dielectric layer 52 are sequentially anisotropically etched employing at least one anisotropic etch process. The portions of the first semiconductor channel layer 601L, the tunneling dielectric layer 56, the charge trapping layer 54, and the blocking dielectric layer 52 located above the top surface of the insulating cap layer 70 can be removed by the at least one anisotropic etch process. Further, the horizontal portions of the first semiconductor channel layer 601L, the tunneling dielectric layer 56, the charge trapping layer 54, and the blocking dielectric layer 52 at a bottom of each cavity 49' can be removed to form openings in remaining portions thereof.

Each remaining portion of the first semiconductor channel layer 601L constitutes a first semiconductor channel portion 601. A surface of the epitaxial channel portion 11 can be physically exposed underneath the opening through the first semiconductor channel portion 601, the tunneling dielectric layer 56, the charge trapping layer 54, and the blocking dielectric layer 52. Optionally, the physically exposed portion of the epitaxial channel portion 11 can be vertically recessed. Each tunneling dielectric layer 56 is surrounded by a charge trapping layer 54.

The set of the tunneling dielectric layer 56, the charge trapping layer 54, and the blocking dielectric layer 52 collectively constitutes a memory film 50. In one embodiment, the first semiconductor channel portion 601, the tunneling dielectric layer 56, the charge trapping layer 54, and the blocking dielectric layer 52 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 10:
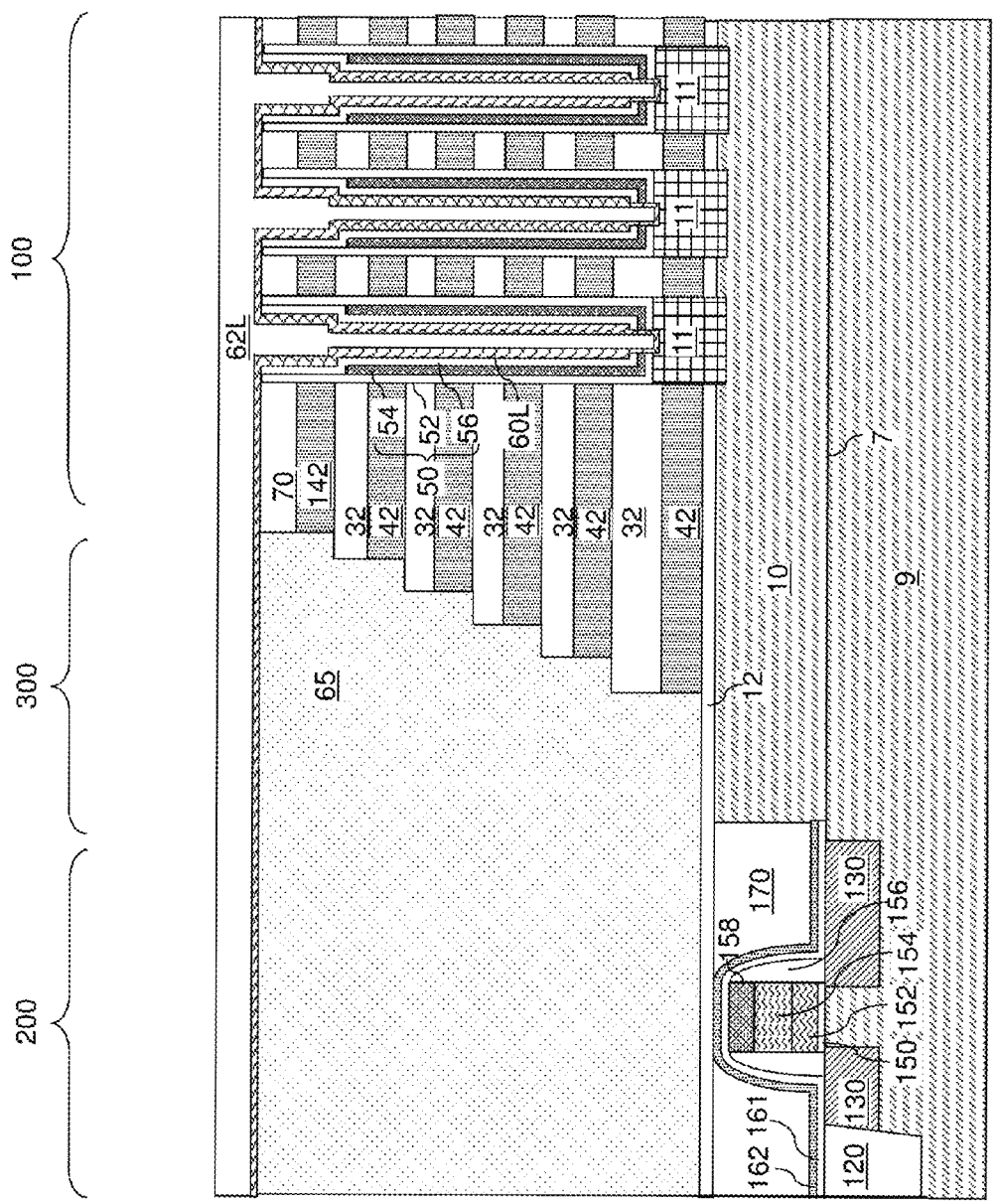
FIG. 10 is a vertical cross-sectional view of the exemplary structure after depositing a second semiconductor channel layer and a dielectric core layer according to an embodiment of the present disclosure.

Referring to FIG. 10, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

In case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 11:
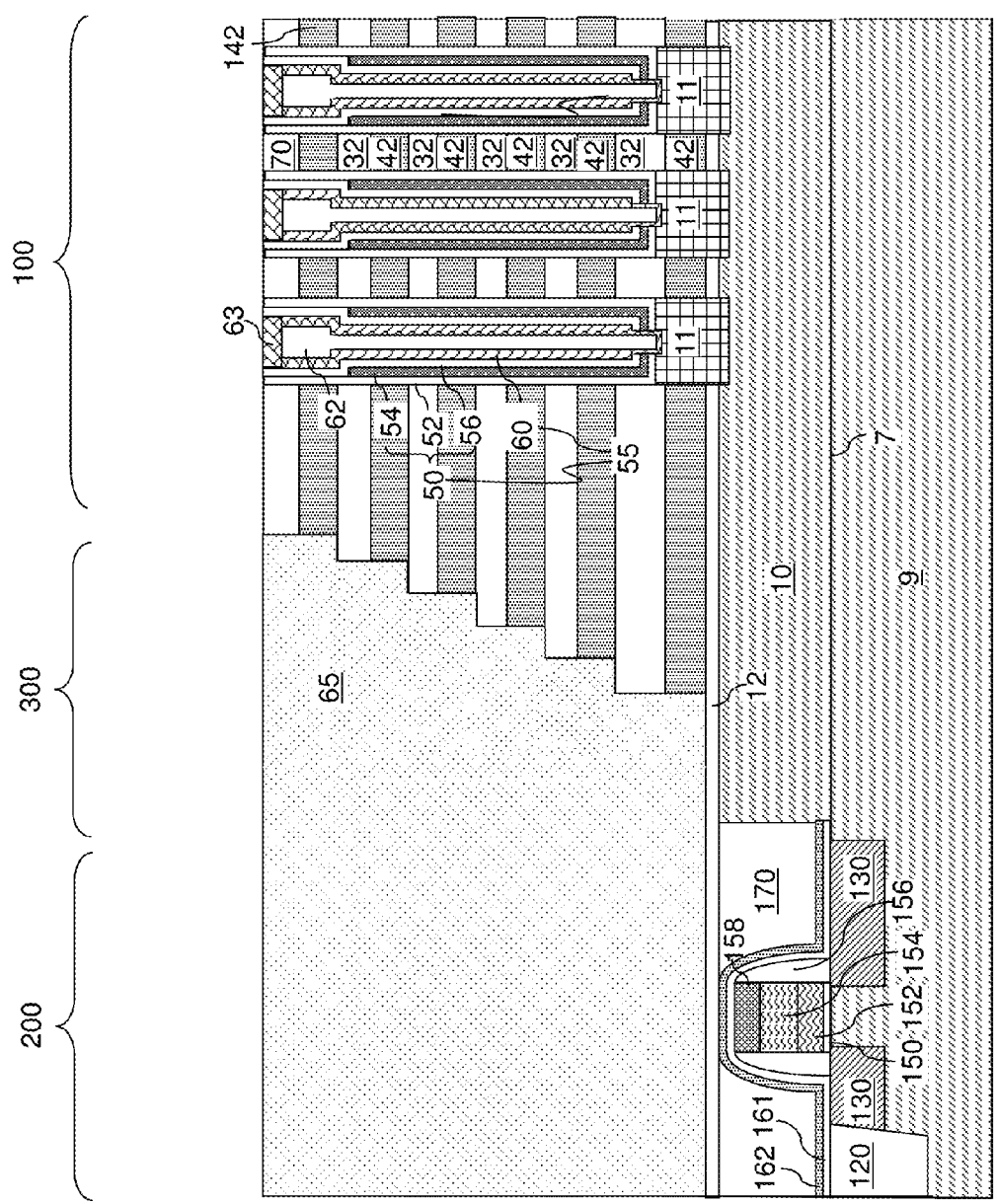
FIG. 11 is a vertical cross-sectional view of the exemplary structure after formation of dielectric cores and drain regions according to an embodiment of the present disclosure.

Referring to FIG. 11, the horizontal portion of the dielectric core layer 62L above the insulating cap layer 70 can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 56 is surrounded by charge trapping layer 54, and laterally surrounds a portion of the vertical semiconductor channel 60. Each adjoining set of a blocking dielectric layer 52, a charge trapping layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62. Each tunneling dielectric layer 56 and each vertical semiconductor channel 60 is surrounded by the remaining lower portion of the charge trapping layer 54 (as provided after the etch process of FIG. 6) and the blocking dielectric layer 52. Each dielectric core 62 is formed inside a respective vertical semiconductor channel 60.

A drain region 63 can be formed at an upper end of the vertical semiconductor channel 60. The drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Each set of a memory film 50 and a semiconductor channel 60 (e.g., 601, 602) in a same memory opening constitutes a memory stack structure 55. The memory stack structures 55 are formed through the in-process alternating stack of the insulating layers 32 and sacrificial material layers (42, 142).

Figure 12A:
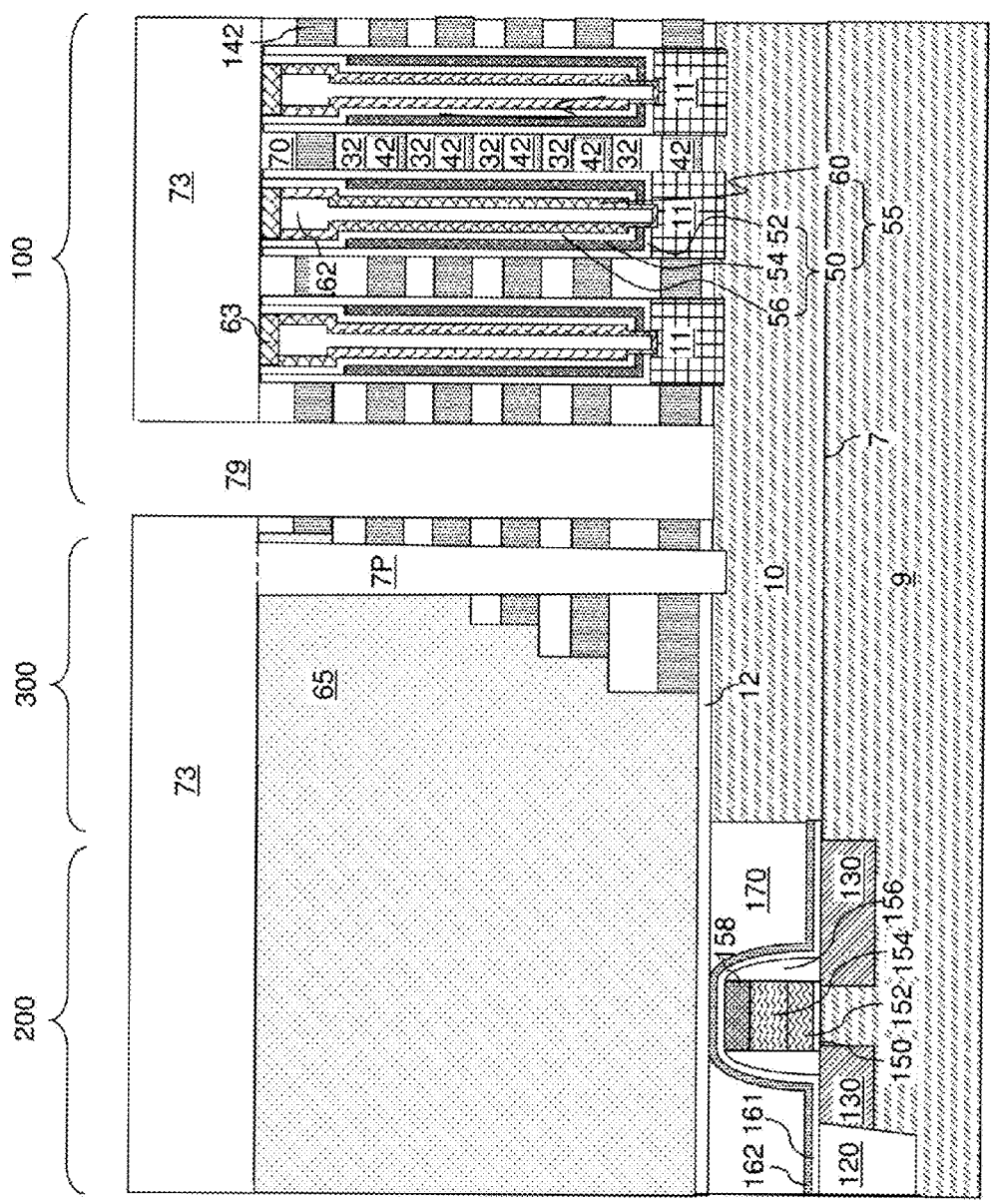
FIG. 12A is a vertical cross-sectional view of the exemplary structure after formation of a backside trench according to an embodiment of the present disclosure.

Referring to FIGS. 12A and 12B, at least one dielectric support pillar 7P may be optionally formed through the retro-stepped dielectric material portion 65 and/or through the alternating stack (32, 42, 142). The plane A-A' in FIG. 12B corresponds to the plane of the vertical cross-sectional view of FIG. 12A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42, 142) and at least to the top surface of the substrate (9, 10), and by filling the opening with a dielectric material that is resistant to the etch chemistry to be employed to remove the sacrificial material layers (42, 142).

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. In an alternative embodiment, formation of the contact level dielectric layer 73 may be omitted, and at least one via level dielectric layer may be subsequently formed, i.e., after formation of a substrate contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42, 142) and/or the retro-stepped dielectric material portion 65, and lithographically patterned to form at least one trench. Each of the at least one trench is herein referred to as a backside trench 79, i.e., a trench that is located in a different region than the memory stack structures 55 that are formed in the memory openings (which are referred to as front side openings). The backside trench 79 may comprise an isolation trench which isolates adjacent memory blocks and/or a source trench which contains a source contact via (i.e., source electrode or local interconnect) which will be described below. Each backside trench 79 can be formed in an area in which formation of a substrate contact via structure is desired. The trench 79 may extend through region 100 or through both regions 100 and 300. The pattern in the photoresist layer can be transferred through the alternating stack (32, 42, 142) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 13:
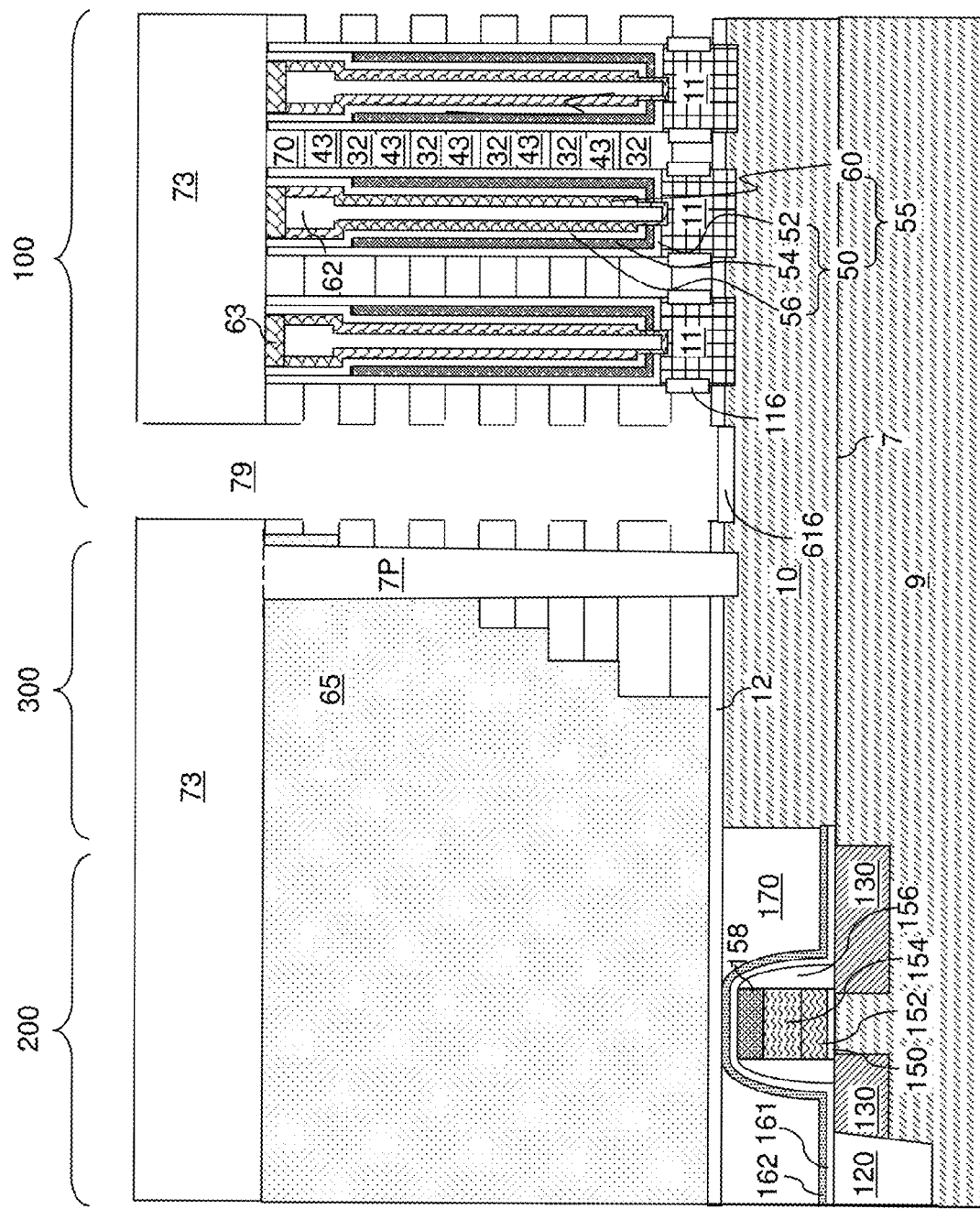
FIG. 13 is a vertical cross-sectional view of the exemplary structure after formation of backside recesses according to an embodiment of the present disclosure.

Referring to FIG. 13, an etchant that selectively etches the second material of the sacrificial material layers (42, 142) with respect to the first material of the insulating layers 32 can be introduced through the at least one backside trench 79, for example, employing an etch process. Backside recesses 43 are formed in volumes from which the sacrificial material layers (42, 142) are removed.

The removal of the second material of the sacrificial material layers (42, 142) can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers (42, 142) can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers (42, 142) can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers (42, 142) include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers (42, 142).

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers (42, 142) is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 14:
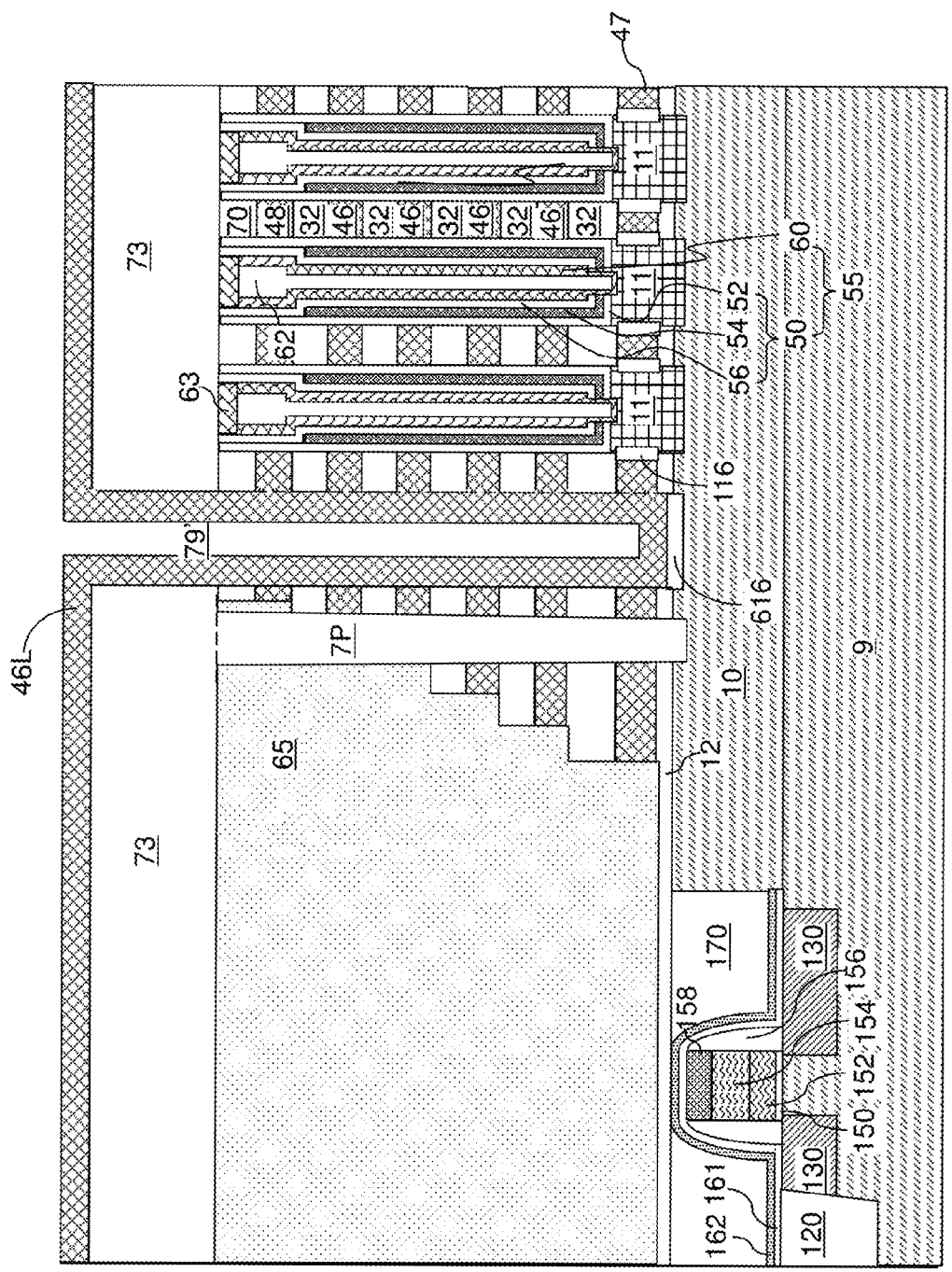
FIG. 14 is a vertical cross-sectional view of the exemplary structure after formation of electrically conductive layers according to an embodiment of the present disclosure.

Referring to FIG. 14, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric layer 52 is present within each memory opening, the backside blocking dielectric layer is optional. In case a blocking dielectric layer 52 is omitted, the backside blocking dielectric layer is present.

At least one metallic material can be deposited in the plurality of backside recesses 43, on the sidewalls of the at least one the backside trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside trench 79 and over the contact level dielectric layer 73. Thus, each sacrificial material layer (42, 142) can be replaced with an electrically conductive layer 46L. A backside cavity 79' is present in the portion of each backside trench 79 that is not filled with the backside blocking dielectric layer and the continuous metallic material layer 46L.

Figure 15:
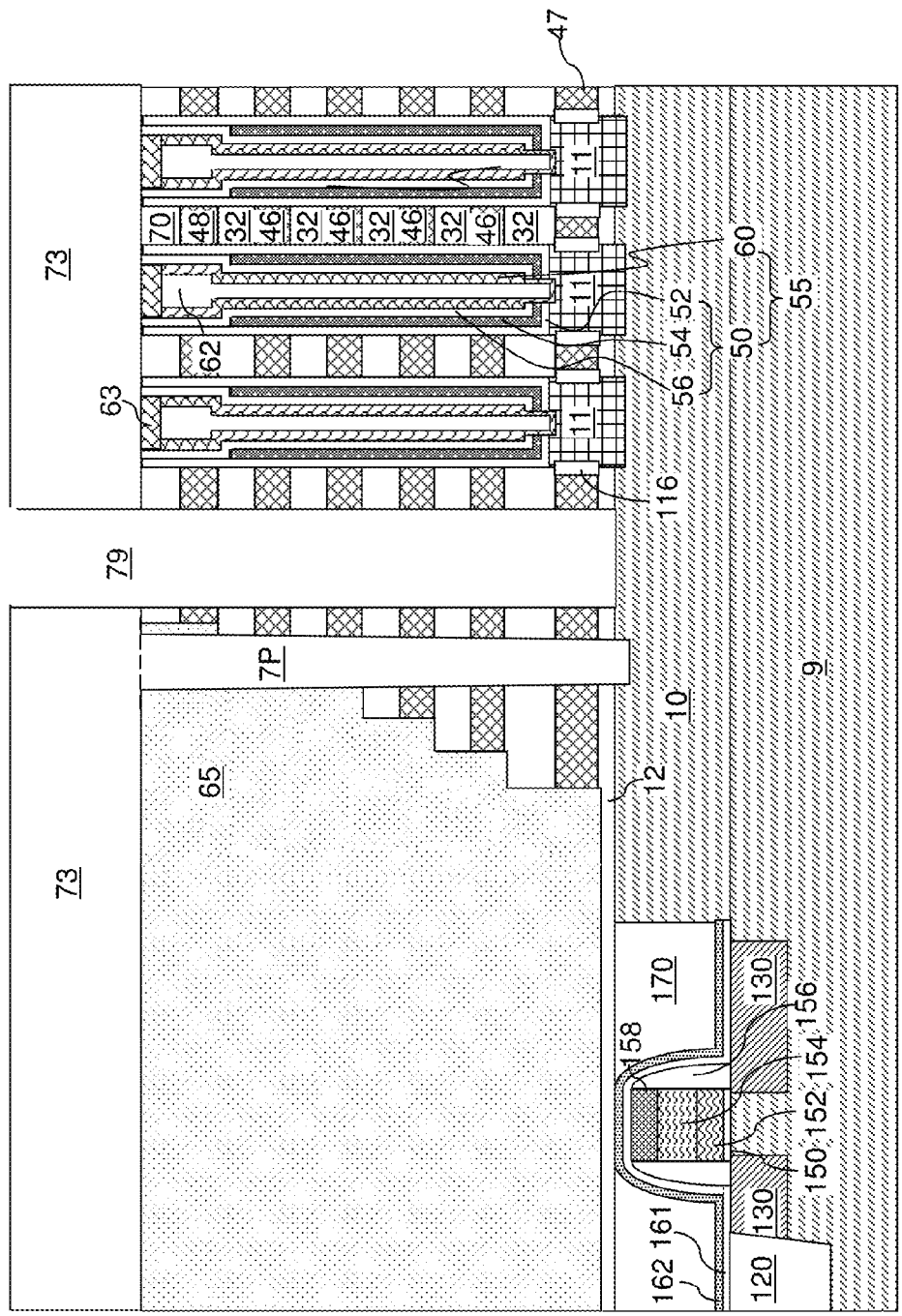
FIG. 15 is a vertical cross-sectional view of the exemplary structure after removal of a deposited conductive material from within the backside trench according to an embodiment of the present disclosure.
Figure 16:
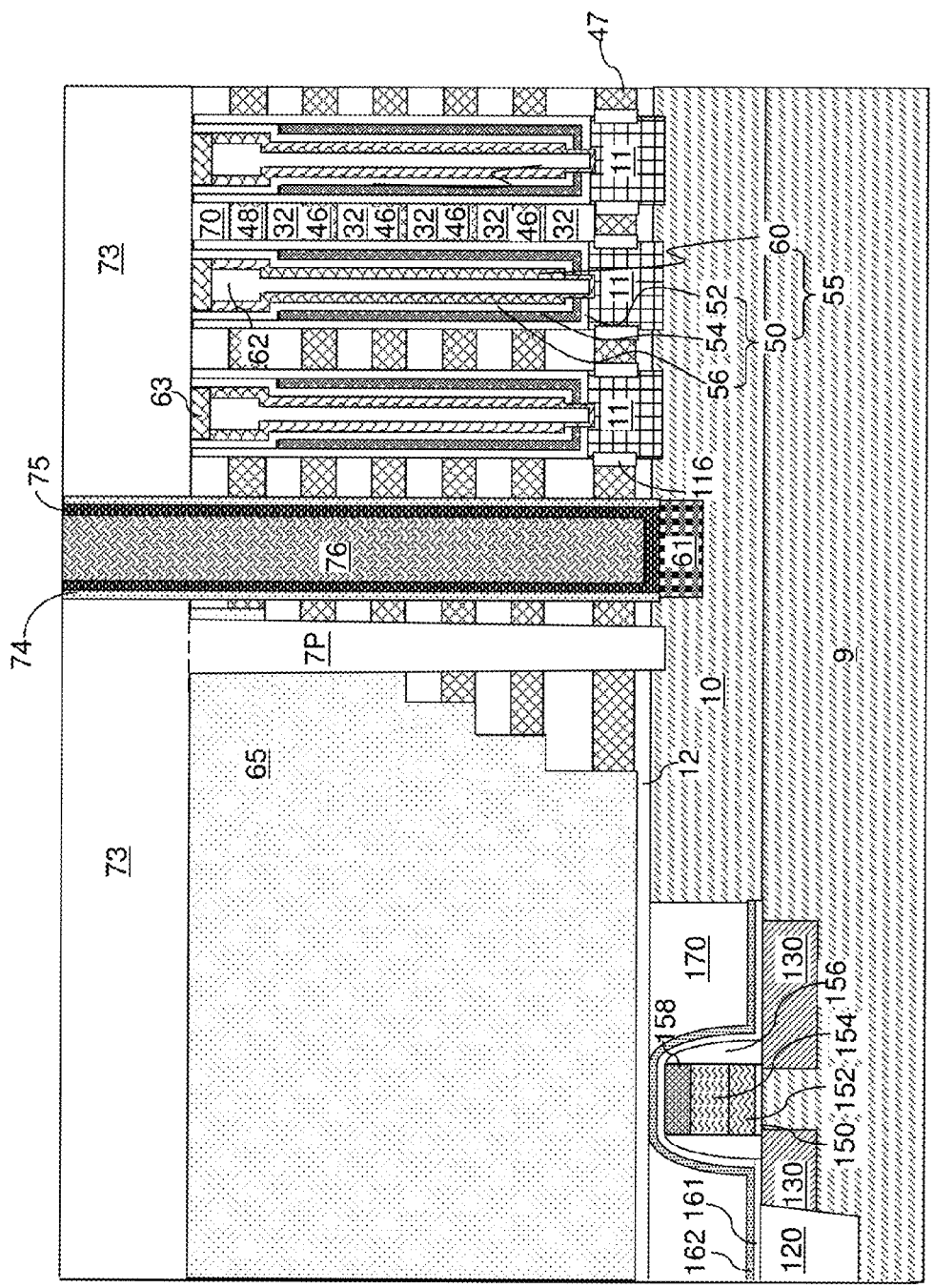
FIG. 16 is a vertical cross-sectional view of the exemplary structure after formation of insulating spacers and backside contact structures according to an embodiment of the present disclosure.

Referring to FIG. 15, the deposited metallic material of the continuous metallic material layer 46L is etched back from the sidewalls of each backside trench 79 and from above the contact level dielectric layer 73, for example, by an isotropic wet etch or dry etch or the combination of isotropic wet etch and dry etch. Optionally, the sacrificial dielectric portions 616 can be removed from above the semiconductor material layer 10 during the last processing step of the anisotropic etch.

Each remaining portion of the deposited metallic material in the backside recesses 43 constitutes an electrically conductive layer (46, 47, 48). Each electrically conductive layer (46, 47, 48) can be a conductive line structure. Thus, the sacrificial material layers (42, 142) are replaced with the electrically conductive layers (46, 47, 48). Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. One or more electrically conductive layers 47 located at the bottom of the stack (i.e., below layers 46) can function as a source select gate electrode for the NAND string and one or more electrically conductive layers 48 located at the top of the stack (i.e., above layers 46) can function as a drain select gate electrode for the NAND string.

In one embodiment, the spacer material layers in the initial alternating stack can include sacrificial material layers (42, 142), and the sacrificial material layers (42, 142) can be replaced with electrically conductive layers (46, 47, 48). In this case, the in-process alternating stack of the insulating layers 32 and sacrificial material layers (42, 142) is modified during the processing steps of FIGS. 12-15 to form an alternating stack of the insulating layer 32 and the electrically conductive layers (46, 47, 48).

In one embodiment, the remaining portions of the charge trapping layer 54 comprises charge storage regions for a NAND string. A first subset of the electrically conductive layers 46 formed at levels at which the remaining portion of the charge trapping layer 54 is present comprises control gate electrodes for the NAND string. Thus, the first subset of the electrically conductive layers 46 replaces the first subset of the sacrificial material layers that are the control-gate-level sacrificial material layers 42. A second subset of the electrically conductive layers 48 formed at a level above a topmost portion of the remaining portion of the charge trapping layer 54 comprises at least one drain select gate electrode for the NAND string. Thus, the second subset of the electrically conductive layers 48 replaces the second subset of the at least one sacrificial material layers that is the at least one drain-select-level sacrificial material layer 142.

Alternatively, the spacer material layers can be formed as electrically conductive layers (46, 47, 48). In this case, the epitaxial channel portions 11 can be omitted, or can be formed to a lesser height, to avoid electrical shorts with the electrically conductive layers 47, and the processing steps of FIGS. 13-15 can be omitted.

A source region 61 can be formed in a surface portion of the substrate (e.g., in the semiconductor material layer 10) underneath each backside trench 79. Each source region 61 can be formed by implanting electrical dopants through each backside trench 79 into a semiconductor portion located on, or within, the substrate (9, 10). For example, a source region 61 may be formed by implantation of dopant atoms into a portion of the semiconductor material layer 10 through each backside trench 79. Alternatively, a source region 61 can be formed on the substrate (9, 10) as a doped semiconductor portion by deposition of a semiconductor material, for example, by selective epitaxy, and by implantation of electrical dopants into the deposited semiconductor portion.

An insulating material layer 74 can be deposited by a conformal deposition process such as a chemical vapor deposition process. The insulating material layer includes a dielectric material such as silicon oxide, silicon nitride, silicon oxynitride, or a combination thereof. In one embodiment, the insulating material can include undoped silicate glass (USG). The thickness of the insulating material layer can be in a range from 3 nm to 30 nm, although lesser and greater thicknesses can also be employed.

An anisotropic etch can be performed to remove horizontal portions of the insulating material layer from above the contact level dielectric layer 73 and from a bottom portion of each backside trench 79. The anisotropic etch can be a reactive ion etch that etches the dielectric material of the insulating material layer selective to the aluminum oxide material of the continuous conformal aluminum oxide layer. In one embodiment, the reactive ion etch can employ at least one fluorocarbon etchant such as $CF_4$ and/or $CHF_3$, and optionally oxygen. Such fluorocarbon-based reactive ion etch chemistries are generally selective to aluminum oxide. Each remaining portion of the insulating material layer constitutes an insulating spacer 74.

In case a portion of the backside trench 79 has a substantially rectangular horizontal cross-sectional area, the insulating spacer 74 can have a pair of parallel vertical portions laterally spaced from each other by a uniform distance. Further, each parallel vertical portion of the insulating spacer 74 can have a uniform lateral thickness at a bottom portion and a middle portion. The anisotropic etch can cause formation of tapers at the top portion of each insulating spacer 74. In this case, each insulating spacer 74 can have a tapered profile at a top portion. In other words, the lateral thickness of each insulating spacer 74 can decrease with a vertical distance from the top surface of the substrate (9, 10).

At least one conductive material can be deposited to fill each backside cavity laterally surrounded by a respective insulating spacer 74. The at least one conductive material can include, for example, a combination of a conductive metallic nitride (such as TiN, TaN, or WN) that can be employed to form a conductive diffusion barrier layer, and a conductive fill material (such as W, Cu, Al, Ru, Co, and/or a heavily doped conductive semiconductor material). The at least one conductive material can be deposited by physical vapor deposition (PVD), chemical vapor deposition (CVD), electroplating, electroless plating, or a combination thereof. Excess portions of the at least one conductive material can be removed from above the top surface of the contact level dielectric layer 73 by a planarization process, which may employ a recess etch or chemical mechanical planarization (CMP). A contact via structure is formed within each backside trench 79, which is herein referred to as a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Figure 17:
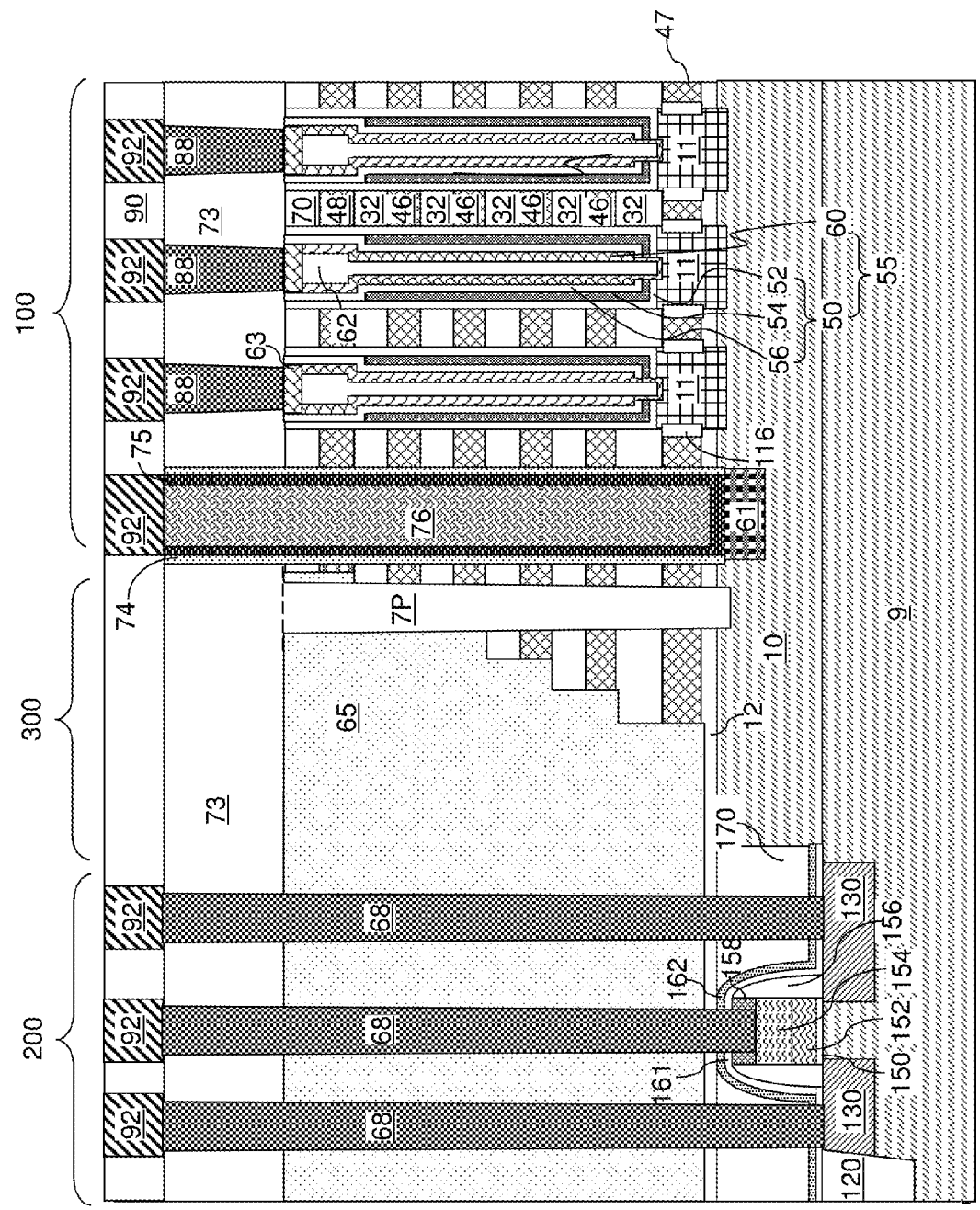
FIG. 17 is a vertical cross-sectional view of the exemplary structure after formation of additional contact via structures and metal lines according to an embodiment of the present disclosure.

Referring to FIG. 17, additional contact via structures (88, 68) can be formed through the contact level dielectric layer 73, and/or the retro-stepped dielectric material portion 65. The additional contact via structures (88, 68) can include, for example, drain contact via structures 88 that contact respective drain regions 63, and peripheral device contact via structures 68 that contact various nodes of the devices (such as circuit drivers) in the peripheral device region 200. Further, the additional contact via structures can include word line contact via structures (not shown) that contact the first subset of the electrically conductive layers 46 that functions as control gate electrodes for the NAND string, and drain select contact via structures (not shown) that contact the second subset of the electrically conductive layers 46 that functions as at least one drain select gate electrodes for the NAND string.

A line level dielectric layer 90 can be deposited over the contact level dielectric layer 73, the insulating spacers 74, and the substrate contact via structures 76. As used herein, a "line level dielectric material layer" refers to a dielectric material layer through which at least one line structure, i.e., at least one laterally extending conductive structure, is subsequently formed. The line level dielectric layer 90 can include a dielectric material such as silicon oxide, silicon nitride, silicon oxynitride, organosilicate glass, any porous derivative thereof, or a combination thereof. The line level dielectric layer 90 can be deposited by chemical vapor deposition or spin coating. The line level dielectric layer 90 can be deposited directly on the surfaces of the contact level dielectric layer 73 and the substrate contact via structures 76. Various metal lines 92 can be formed in the via level, such as bit lines.

The exemplary device of the present disclosure can include a three-dimensional memory device. The three-dimensional memory device can include an alternating stack of insulating layers 32 and electrically conductive layers (46, 47, 48) located over a substrate (9, 10), and a memory stack structure 55 extending through the alternating stack and comprising a memory film 50 and a vertical semiconductor channel 60 contacting an inner sidewall of the memory film 50. A lower portion of the memory film 50 comprises a first lateral stack including, from outside to inside, a lower portion of a blocking dielectric layer 52, a charge trapping layer 54, and a lower portion of a tunneling dielectric layer 56. An upper portion of the memory film 50 comprises a second lateral stack including, from outside to inside, an upper portion of the blocking dielectric layer 52 and an upper portion of the tunneling dielectric layer 56 in physical contact with the upper portion of the blocking dielectric layer 52.

In one embodiment, the lower portion of the blocking dielectric layer 52 is located at levels of a first subset of the electrically conductive layers 46 excluding a topmost electrically conductive layer 48, and the upper portion of the blocking dielectric layer 52 is located at one or more levels of a second subset of the electrically conductive layers 46 including the topmost electrically conductive layer 48. In one embodiment, the first subset of the electrically conductive layers 46 is laterally offset farther away from the vertical semiconductor channel 60 than the second subset of the electrically conductive layers 48 is laterally offset from the vertical semiconductor channel 60. In one embodiment, the memory film 50 comprises a vertical stack of charge storage regions for a NAND string (as embodied as discrete portions of the charge storage layer 54 located at the levels of the first subset of the electrically conductive layers 46), the first subset of the electrically conductive layers 46 comprises control gate electrodes for the NAND string, and the second subset of the electrically conductive layers 48 comprises a drain select gate electrode for the NAND string.

In one embodiment, a topmost portion of the charge trapping layer 54 is located underneath the upper portion of the memory film 50. In one embodiment, the vertical semiconductor channel 60 comprises an annular ledge at which an upper outer sidewall of the vertical semiconductor channel is laterally offset outward with respect to a lower outer sidewall of the vertical semiconductor channel 60. In one embodiment, a dielectric core 62 can comprise another annular ledge at which an upper sidewall of the dielectric core 62 is laterally offset outward with respect to a lower sidewall of the dielectric core 62.

In one embodiment, the charge trapping layer 54 can comprise a continuous silicon nitride layer. In one embodiment, a drain region 63 can be located at a top end of each vertical semiconductor channel 60. In one embodiment, the material composition of the upper portion of the blocking dielectric layer 52 may differ from the material composition of the lower portion of the blocking dielectric layer 52 by presence of boron atoms as a dopant species, which diffuse into blocking dielectric layer 52 through the charge trapping layer 54 during ion implantation and/or during a subsequent anneal.

In one embodiment, the three-dimensional memory device comprises a monolithic three-dimensional NAND memory device. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The device of embodiments of the present disclosure does not include any charge trapping material between the second subset of the electrically conductive layers 48 (which function as at least one drain select gate electrode) and the vertical semiconductor channel 60. Specifically, the gate dielectric for the second subset of the electrically conductive layers 48 can consist of the blocking dielectric layer 52 and the tunneling dielectric layer 56. In one embodiment, the blocking dielectric layer 52 can include a silicon oxide layer, an aluminum oxide layer, or a combination thereof, and the tunneling dielectric layer 56 can include an ONO stack or a silicon oxide layer. Thus, unwanted charge trapping in the gate dielectric for the at least one drain select gate electrode is avoided by removing the charge trapping layer 54 from the gate dielectric of the at least one drain select gate electrode. Without charge trapping in the gate dielectric or consequent threshold voltage shift, the at least one drain select transistor controlled by the at least one drain select gate electrode can reliably select a vertical semiconductor channel 60 to be activated for programming or sensing operation. Thus, the drain select transistor is more stable, and in some embodiments, only one drain select gate electrode 48 may be used per NAND string, rather than a stack of two through four drain select gate electrodes that may be used in prior art devices. This decreases the stack height and decreases the device complexity and processing cost. Generally speaking, the number of select drain gate electrodes can selected based not only by the threshold voltage stability, but also by the gate length of the select drain gate electrodes. Thus, in other embodiments, plural drain select gate electrodes 48 may be used per NAND string.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate; and
a memory stack structure extending through the alternating stack and comprising a memory film and a vertical semiconductor channel contacting an inner sidewall of the memory film, wherein:
a lower portion of the memory film comprises a first lateral stack including, from outside to inside, a lower portion of a blocking dielectric layer, a charge trapping layer, and a lower portion of a tunneling dielectric layer; and
an upper portion of the memory film comprises a second lateral stack including, from outside to inside, an upper portion of the blocking dielectric layer and an upper portion of the tunneling dielectric layer in physical contact with the upper portion of the blocking dielectric layer, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

2. The three-dimensional memory device of claim 1, wherein:
the lower portion of the blocking dielectric layer is located at levels of a first subset of the electrically conductive layers excluding a topmost electrically conductive layer; and
the upper portion of the blocking dielectric layer is located at one or more levels of a second subset of the electrically conductive layers including the topmost electrically conductive layer.

3. The three-dimensional memory device of claim 2, wherein the first subset of the electrically conductive layers is laterally offset farther away from the vertical semiconductor channel than the second subset of the electrically conductive layers is laterally offset from the vertical semiconductor channel.

4. The three-dimensional memory device of claim 2, wherein:
the memory film comprises a vertical stack of charge storage regions for a NAND string;
the first subset of the electrically conductive layers comprises control gate electrodes for the NAND string; and
the second subset of the electrically conductive layers comprises a drain select gate electrode for the NAND string.

5. The three-dimensional memory device of claim 1, wherein a topmost portion of the charge trapping layer is located underneath the upper portion of the memory film.

6. The three-dimensional memory device of claim 1, wherein the vertical semiconductor channel comprises an annular ledge at which an upper outer sidewall of the vertical semiconductor channel is laterally offset outward with respect to a lower outer sidewall of the vertical semiconductor channel.

7. The three-dimensional memory device of claim 1, wherein the charge trapping layer comprises a continuous silicon nitride layer.

8. The three-dimensional memory device of claim 1, further comprising a drain region located at a top end of the vertical semiconductor channel.

9. The three-dimensional memory device of claim 1, wherein a material composition of the upper portion of the blocking dielectric layer differs from a material composition of the lower portion of the blocking dielectric layer by presence of boron atoms as a dopant species.

10. A three-dimensional memory device, comprising:
an alternating stack of insulating layers and electrically conductive layers located over a substrate;
a memory stack structure extending through the alternating stack and comprising a memory film and a vertical semiconductor channel contacting an inner sidewall of the memory film, wherein the vertical semiconductor channel comprises an annular ledge at which an upper outer sidewall of the vertical semiconductor channel is laterally offset outward with respect to a lower outer sidewall of the vertical semiconductor channel; and
a dielectric core that comprises another annular ledge at which an upper sidewall of the dielectric core is laterally offset outward with respect to a lower sidewall of the dielectric core, wherein:
a lower portion of the memory film comprises a first lateral stack including, from outside to inside, a lower portion of a blocking dielectric layer, a charge trapping layer, and a lower portion of a tunneling dielectric layer; and
an upper portion of the memory film comprises a second lateral stack including, from outside to inside, an upper portion of the blocking dielectric layer and an upper portion of the tunneling dielectric layer in physical contact with the upper portion of the blocking dielectric layer.

11. The three-dimensional memory device of claim 10, wherein:

the lower portion of the blocking dielectric layer is located at levels of a first subset of the electrically conductive layers excluding a topmost electrically conductive layer; and the upper portion of the blocking dielectric layer is located at one or more levels of a second subset of the electrically conductive layers including the topmost electrically conductive layer.

12. The three-dimensional memory device of claim 11, wherein the first subset of the electrically conductive layers is laterally offset farther away from the vertical semiconductor channel than the second subset of the electrically conductive layers is laterally offset from the vertical semiconductor channel.

13. The three-dimensional memory device of claim 11, wherein:

the memory film comprises a vertical stack of charge storage regions for a NAND string;

the first subset of the electrically conductive layers comprises control gate electrodes for the NAND string; and the second subset of the electrically conductive layers comprises a drain select gate electrode for the NAND string.

14. The three-dimensional memory device of claim 10, wherein a topmost portion of the charge trapping layer is located underneath the upper portion of the memory film.

15. The three-dimensional memory device of claim 10, wherein the charge trapping layer comprises a continuous silicon nitride layer.

16. The three-dimensional memory device of claim 10, further comprising a drain region located at a top end of the vertical semiconductor channel.

17. The three-dimensional memory device of claim 10, wherein a material composition of the upper portion of the blocking dielectric layer differs from a material composition of the lower portion of the blocking dielectric layer by presence of boron atoms as a dopant species.

18. The three-dimensional memory device of claim 10, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *